United States Patent [19]
Mehrotra et al.

[11] Patent Number: 6,061,508
[45] Date of Patent: May 9, 2000

[54] MODELING AND PROCESSING OF ON-CHIP INTERCONNECT CAPACITANCE

[75] Inventors: Sharad Mehrotra, Austin, Tex.; Jagannathan Narasimhan, Millwood; Albert Emil Ruehli, Chappaqua, both of N.Y.

[73] Assignee: International Business Machines Corporation, Armonk, N.Y.

[21] Appl. No.: 08/888,060

[22] Filed: Jul. 3, 1997

[51] Int. Cl.[7] .................................................... G06F 17/50
[52] U.S. Cl. ............................... 395/500.07; 395/500.03; 395/500.09
[58] Field of Search .................................. 364/488–491, 364/578; 395/500.02–500.19

[56] References Cited

U.S. PATENT DOCUMENTS

| | | | |
|---|---|---|---|
| 5,452,224 | 9/1995 | Smith, Jr. et al. | 395/500.2 |
| 5,629,860 | 5/1997 | Jones et al. | 395/500.07 |
| 5,706,206 | 1/1998 | Hammer et al. | 395/500.06 |
| 5,761,076 | 6/1998 | Miki | 395/500.06 |
| 5,761,080 | 6/1998 | DeCamp et al. | 395/500.06 |
| 5,831,870 | 11/1998 | Folta et al. | 395/500.06 |
| 5,838,582 | 11/1998 | Mehrotra et al. | 395/500.06 |
| 5,847,967 | 12/1998 | Asao | 395/500.06 |

OTHER PUBLICATIONS

Jiang et al. ("Fast extraction of the capacitance matrix of multilayered multiconductor interconnects using the method of lines", 1997 IEEE Multi–Chip Module Conference, Feb. 4, 1997, pp. 98–101).

Heab et al. ("Approximate time–domain models of three–dimensional interconnects", IEEE International Conference on Computer Design: VLSI in Computers and Processors, Sep. 17, 1990, pp. 201–205).

Omer et al., "The per–unit–length capacitance matrix of flaring VLSI packaging interconnections", IEEE Transactions on Components, Hybrids, and Manufacturing Technology, vol. 14, No. 4, Dec. 1991, pp. 749–754.

Helmsen et al., "Computations of capacitance matrices for ESD between 3–dimensional bodies", Conference Record of the 1990 IEEE Industry Applications Society Annual Meeting, vol. 1, Oct. 7, 1990, pp. 826–831.

(List continued on next page.)

*Primary Examiner*—Kevin J. Teska
*Assistant Examiner*—Phallaka Kik
*Attorney, Agent, or Firm*—Louis P. Herzberg

[57] ABSTRACT

An apparatus and method is presented for capacitance analysis in chip environments for arbitrary geometries. It uses a process which combines 2-dimensional ascertainments where the length is chosen to fit the solution. Also, the required accuracy may be limited to be within an error range. The technique is also applicable for the analysis of three dimensional capacitances, and importantly also for a mixture of two and three dimensional capacitance ascertainments. In an embodiment the process divides the space into a set of subspaces. The capacitance value for the subspaces are determined using the parallel plate capacitance formula.

42 Claims, 12 Drawing Sheets

OTHER PUBLICATIONS

Le Coz et al., "A high–speed capacitance extraction algorithm for multi–level VLSI interconnects", Proceedings of the Eight International IEEE, VLSI Multilevel Interconnection Conference, Jun. 11, 1991, pp. 364–366.

Dimopoulos et al., "PEM/sup 3/: a CAD program for electrical modelling of on–chip multilayer metallizations", Proceedings of the 6th Mediterranean Electrotechnical Conference, vol. 1, May 1991, pp. 255–258.

Janak et al., "C3DSTAR: a 3D wiring capacitance calculator", 1989 IEEE International Conference on Computer–Aided Design, ICCAD–89, Digest of Technical Papers, Nov. 5, 1989, pp. 530–533.

Ouda et al., "Minimizing the computational cost and memory requirements for the capacitance calculation of 3–D multiconductor systems", IEEE Transactions on Components, Packaging, and Manufacturing Technology, vol. 18, No. 3, Sep. 1995, pp. 685–689.

Huang, "Two–dimensional capacitance calculation in stratified and/or arbitrary dielectric media", IEEE Transactions on Microwave Theory and Techniques, vol. 42, No. 3, Mar. 1994, pp. 501–504.

Nabors et al., "A fast multipole algorithm for capacitance extraction of complex 3–D geometries", Proceedings of the IEEE 1998 Custom Integrated Conference, May 15, 1989, pp. 21.7/1–4.

Ruehli et al., Efficient Capacitance Calculations for Three–Dimensional Multiconductor Systems, IEEE Transactions on Microwave Theory and Techniques, vol. MTT–21 (2), pp. 76–82, Feb. 1973.

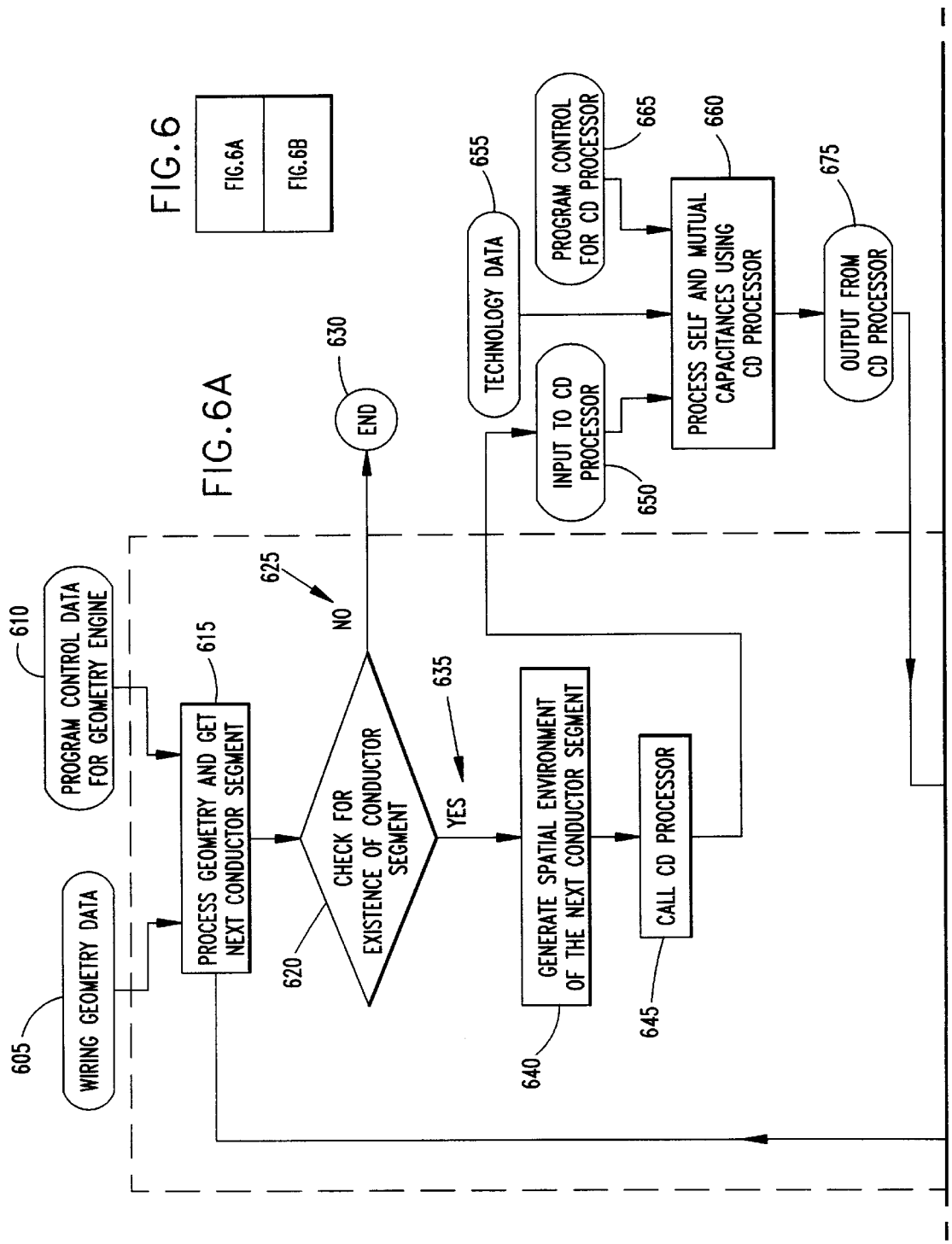

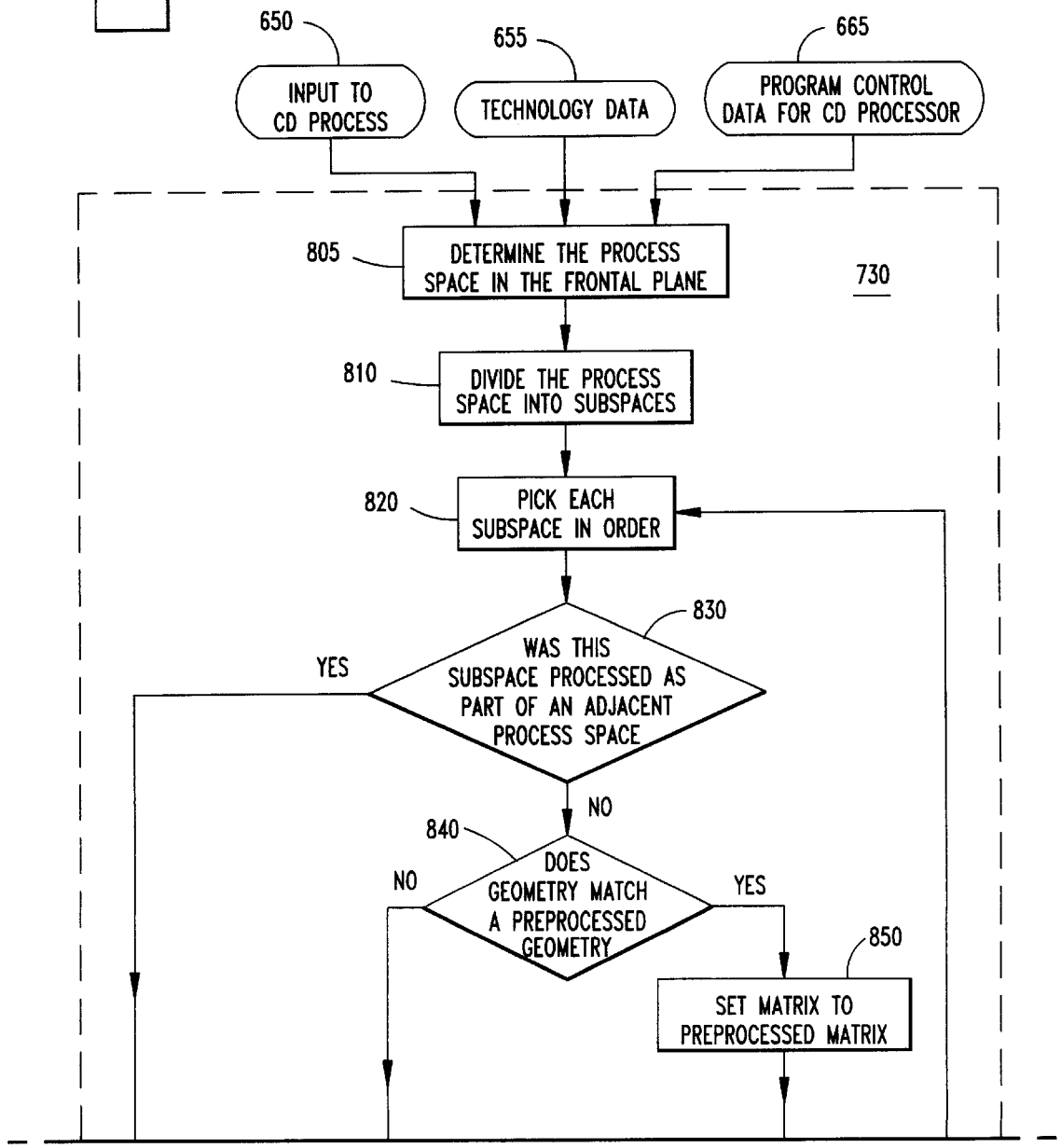

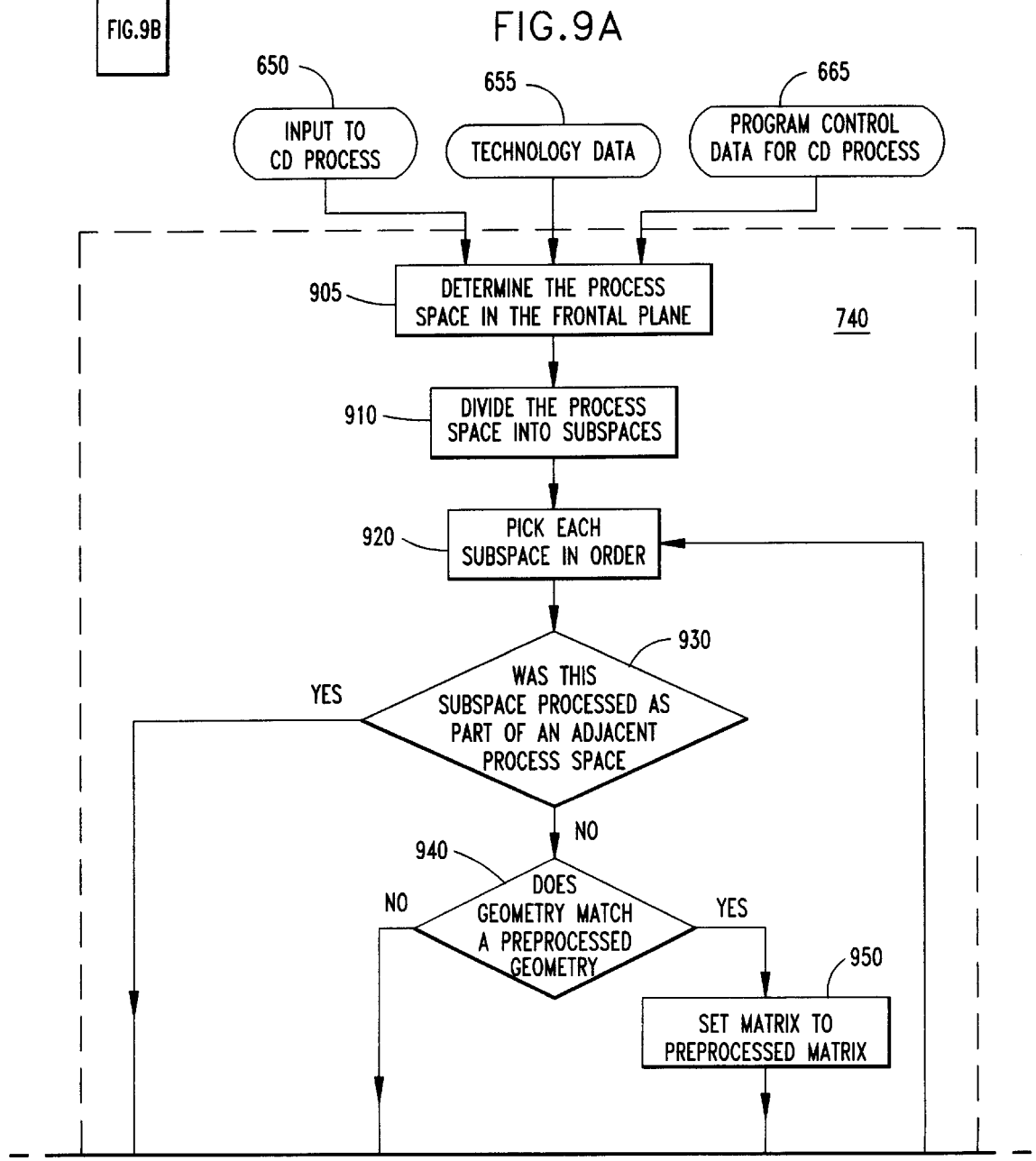

MODELING AND PROCESSING OF ON-CHIP INTERCONNECT CAPACITANCE

FIELD OF THE INVENTION

The present invention is directed to the field of electrical analysis. It is more particularly directed to interconnect analysis of a chip.

BACKGROUND OF THE INVENTION

With the increasing clock speeds and decreasing feature sizes of VLSI (very large scale integrated) chips, analysis of electrical properties of wiring that connects various devices on the VLSI chip has become extremely important. Several tasks such as noise analysis, determining the timing characteristics, etc. are dependent to a great extent on the electrical properties of the wiring. Interconnect analysis plays a critical role in the design of chips with small feature sizes that are designed to operate at high speeds. An aspect of the present invention is the provision of a method and apparatus for extracting capacitances to model and employ the results obtained for the interconnect wiring for VLSI chips. Because interconnect wiring on a VLSI chip generally encompass millions of miniature shapes, a very efficient approach needs to be employed. Besides being fast, the method must determine capacitances accurately enough for subsequent analysis to have any value. In this document, we first describe the capacitance ascertainment technique and then provide the processes involved in the implementation.

The following explanation will help in understanding the complexity of the problem solved by the present invention, and in understanding terms used in describing the invention. Common circuit connection points are herein referred to as ports of VLSI devices. Ports are typically connected by means of wires running in the various wiring planes of the VLSI chip. Wires in different metal layers are connected by means of vias. A net is a set of wires tied together electrically and used to connect a set of ports. The spaces between two wires consist of a dielectric material and/or air. Many dielectrics are usable, however the dielectric is usually silicon dioxide. To analyze the electrical properties of the interconnect wiring, it is necessary to determine the capacitance between each wire of one net that has capacitive coupling to a wire belonging to different net. Each such pair of coupled wires is herein referred to as being a wire pair. The pair of nets to which the coupled wires belong is herein referred to as a net pair. A coupling capacitance is defined for each net pair $(n_i, n_j)$ as the sum of a plurality of coupling capacitances of the wire pairs $(w_i, w_j)$, where $w_i$ belongs to $n_i$ and $w_j$ belongs to $n_j$. In a practical application a coupling capacitance between two wires is determined only if the wires are in each others proximity. When nets are not in proximity to each other their coupling capacitances are negligibly small. Another capacitance of a wire that is important, called the self capacitance, is that due to the wire's interaction with a reference point that is usually ground.

Wiring levels in a VLSI chip are located above the substrate in a fixed number of metal wiring layers determined by the technology used to fabricate the VLSI chip. In each wiring level, wires are laid either front to back and/or from left to right, when the chip is being viewed from the front with the substrate located at the bottom. The plane of the chip's cross-section that can be seen when the chip is viewed from the front or the back of the chip is herein called the frontal plane (XZ plane). The plane of the cross-section of the chip as seen when viewing the chip from the left or the right is herein called the lateral plane (YZ-plane). A plane of the cross-section that is seen when viewing the chip from the top or bottom is called the wiring plane (XY-plane). The frontal direction (X) is the direction that is orthogonal to the frontal plane and the lateral direction (Y) is the direction orthogonal to the lateral plane. The via direction (Z) is orthogonal to the wiring plane. The X, Y and Z symbols shown in parenthesis provide a short hand notation for these definitions.

FIG. 1 shows an example geometry 100 of a set of crossing wires and the capacitances that are typically required to be determined for such a geometry. Wires labeled $w_2$ 102, and $w_3$ 103, are located in metal layers above and below the metal layer on which the wire labeled $w_1$ 101, is located, respectively. Furthermore, wires $w_2$ 102, and $w_3$ 103, are parallel to each other and are both orthogonal to the wire $w_1$ 101. FIG. 2 shows the capacitances that need to be determined and the equivalent circuit for this configuration of wires. In this circuit, capacitances $c_{12}$ 112, $c_{23}$ 123, and $c_{13}$ 113 are the coupling capacitances between wires $w_1$ 101 and $w_2$ 102, $w_2$ 102 and $w_3$ 103, and, $w_1$ 101 and $w_3$ 103, respectively. Capacitances $c_{11}$ 111, $c_{22}$ 122, and $c_{33}$ 133 are the self capacitances of wires $w_1$ 101, $w_2$ 102, and $w_3$ 104, respectively.

The typical wiring configuration used to interconnect devices on a VLSI chip has many layers and many wires in each layer of metal. As a result, this requires the processing of a very large number of capacitances. In determining these capacitances, it is customary to use a geometry engine to decompose the wiring geometry into manageable units. The capacitance values for each of these units are determined independently. Finally, the determined values are combined to obtain the required capacitance values for the entire geometry. For the purpose of describing the present invention, it is assumed that such a geometry engine is available. Furthermore, it is assumed that each wire is decomposed into rectangular pieces called conductor segments. A conductor segment belongs to the net that contains the wire to which the conductor segment belongs. An environment of a particular conductor segment contains all other conductor segments that are in that particular conductor segment's vicinity, and the spatial separations between them. Environment information includes the sizes and distances of neighboring conductor segments in all the three X, Y and Z dimensions. The geometry engine that decomposes wires into conductor segments, and determines its environment, is based on the well known scan line processor or any other processor that decomposes the geometry efficiently.

An example of a conductor segment and its environment is shown in FIG. 3. In this example there are three metal layers. The particular conductor segment in consideration is labeled $con_c$ 302. This conductor segment is part of wire-w 301 located in metal layer $m_2$ 311. The portions of wire-w 301 that are not part of $con_c$ are not cross-hatched. There are four conductor segments in the environment of $con_c$ 302. Two of them are located in metal layer $m_2$ 311. They are $con_l$ 306 and $con_r$ 303 located to the left and right of $con_c$ 302, respectively. Conductor segment $con_b$ 304 is located on metal layer $m_1$ 312 below $con_c$ 302, and conductor segment $con_t$ 305 is located in metal layer $m_3$ 313 above $m_2$ 311. Coordinate axes X 307, Y 308, and Z 309 are shown in the figure. The frontal plane, lateral plane, and wiring planes are the XZ, YZ and XY planes, respectively. In general the environment of a particular conductor segment could be more complex. A conductor segment generally has many other conductor segments in front, behind or diagonally above or beneath itself.

Given the unit of decomposed geometry, the capacitance processing method described in this document efficiently determines various capacitance values for a multitude of such units. This approach for determining capacitances is also referred to herein as the subcapacitance method or the subcapacitance approach.

Since the number of units of decomposed geometries is extremely large, typically in the order of tens of millions of units even for the simplest of VLSI chips, the capacitance processing must be performed very fast to have any practical use. This requires that the number of arithmetic operations for the capacitance determinations be minimized to save determination time. However, the number of combinations of conductor arrangements that can occur is so large that methods of fitting approximate capacitance formulae are too inaccurate and hence inadequate. Other accurate methods that rely upon solutions to field equations are too slow to cope with the size of the problem.

SUMMARY OF THE INVENTION

An aspect of the present invention is to provide a method to determine a plurality of capacitance values for a group of interconnecting wires that interconnect a plurality of components in a chip with a plurality of conductor segments, using a data set comprised of technology data for the chip, and geometry data for a first segment of the conductor segments and for a corresponding environment of the first segment. The method comprises the steps of: determining a parallel plate capacitance matrix, a frontal 2-dimensional capacitance matrix, and a lateral 2-dimensional capacitance matrix from the data set; merging the parallel plate, frontal and lateral matrices into a merged capacitance matrix; extracting from the merged capacitance matrix a self capacitance value, and a plurality of values for a plurality of coupling capacitances between the first conductor segment and each of a plurality of other conductor segments defined in the environment data; and storing and/or inputing the self capacitance value and the values of coupling capacitances for timing analysis of the chip.

In an embodiment the method uses a next data set comprised of conductor segment data, corresponding environment data, and technology data, for each of the plurality of conductors, the method further comprising the step of repeating the steps of determining, merging, extracting, and storing and/or inputing for the plurality of other conductor segments. In some embodiments the step of determining of a frontal two dimensional capacitance matrix utilizes a grid structure determined by the geometry data and the technology data, and the grid structure enables the control of an accuracy of a determination result and a speed of determination.

In other embodiments: the plurality of conductor segments is a part of a net, and the chip comprises a plurality of nets, the method further comprising the step of combining the self capacitance value and the coupling capacitance values of all of the conductor segments belonging to a same net, thereby forming a net self capacitance and a plurality of net coupling capacitances for each of the nets and/or the step of repeating employs at least one of a plurality of other capacitance determining processes, to obtain the self capacitance and the coupling capacitances for a subset of the plurality of conductor segments.

In some embodiments the step of determining includes: determining a processing space in each of a plurality of planes in which a 2-dimensional capacitance determination is performed; dividing the processing space into a plurality of subspaces; ascertaining a subspace capacitance matrix for each of the subspaces; and merging the subspace capacitance matrix of all the subspaces in the processing space to form a processing space capacitance matrix for the processing space. Often the step of ascertaining comprises: determining a plurality of parallel and non parallel regions within the subspace; determining a parallel plate capacitance value for a plurality of parallel regions not parallel to a via direction; dividing each of the non parallel regions into a grid having a structure determined by the geometry data, and the technology data; setting up an initial capacitance matrix for the grid structure; employing gaussian elimination to eliminate all of a plurality of rows and columns corresponding to a plurality of internal grid elements to obtain the subspace capacitance matrix.

Another aspect of the present invention is an apparatus to determine a plurality of capacitance values for a group of interconnecting wires that interconnect a plurality of components in a chip with a plurality of conductor segments, using a data set comprised of technology data for the chip, geometry data for a first segment of the conductor segments and for a corresponding environment of the first segment, the apparatus comprising: a first processor for determining a parallel plate capacitance matrix, a frontal 2-dimensional capacitance matrix and a lateral 2-dimensional capacitance matrix from the set; a second processor for merging the parallel plate, frontal and lateral matrices into a merged capacitance matrix; a third processor for extracting from the merged capacitance matrix a self capacitance value, and a plurality of values for a plurality of coupling capacitances between the first conductor segment and each of a plurality of other conductor segments defined in the environment data; and storing the self capacitance value and the plurality of values for a plurality of coupling capacitances; or inputing these capacitances in a timing analysis routine from an electrical parameters database. In some embodiments the apparatus further comprising: using a next data set of conductor segment data, corresponding environment data, and technology data, for each next conductor segment of the plurality of conductors; and wherein the first processor determines a parallel plate capacitance matrix, a frontal 2-dimensional capacitance matrix and a lateral 2-dimensional capacitance matrix from the next data set for the each next conductor segment; the second processor merges the parallel plate, frontal and lateral matrices into a merged capacitance matrix for the each next conductor segment; the third processor extracts from the merged capacitance matrix a self capacitance value, and a plurality of values for a plurality of coupling capacitances between the next conductor segment and each of a plurality of other conductor segments defined in the environment data for the each next conductor segment; and storing the self capacitance value and the plurality of values for a plurality of coupling capacitances for the each next conductor segment. It is advantageous that the first processor utilizes a grid structure determined from the next data set, and also the grid structure enable the control of an accuracy of a determination result and a speed of determination. Often the accuracy is inversely proportional with the speed of determination.

In an embodimemt each of the plurality of conductor segments is a part of a net, and the chip comprises a plurality of nets, the apparatus further comprising a fourth processor for combining the self capacitance value and the coupling capacitance values of all of the conductor segments belonging to a same net, to form a net self capacitance and a plurality of net coupling capacitances for each of the nets. Sometimes, the apparatus further comprising a fourth processor for employing at least one other of a plurality of other capacitance determining processes for obtaining the self capacitance and the coupling capacitances, for a subset of the conductor segments.

In another embodiment the first processor determines the frontal, lateral and parallel plate capacitance matrices by: determining a processing space in each of a plurality of planes in which a determination is performed, dividing the processing space into a plurality of subspaces, ascertaining a subspace capacitance matrix for each of the subspaces; and merging the subspace capacitance matrix of all the subspaces in the processing space to form a processing space capacitance matrix for the processing space.

Also, sometimes the first processor ascertains the subspace capacitance matrix by: determining a plurality of parallel and non parallel regions within the subspace, determining a parallel plate capacitance value for a plurality of the parallel regions not parallel to a via direction, dividing each of the non parallel regions into a grid determined by the data set, setting up an initial capacitance matrix for the grid structure, and employing gaussian elimination to eliminate all of a plurality of rows and columns corresponding to a plurality of internal grid elements to obtain the subspace capacitance matrix.

Other embodiments include: the first processor ascertains the information by comparing a first geometry of the subspace with a second geometry in a predefined library, and obtains a library capacitance matrix if a geometry match exists, and/or the subspace capacitance matrix for at least one subspace is obtained from a previous ascertainment if the conductor segment is part of the environment of a previously processed conductor segment, and/or the first processor performs the dividing by using a specialized grid having fewer grid elements, and wherein the setting up is performed by using a plurality of closed form formulae, and/or the subspace capacitance matrix for two or more of the subspaces are determined simultaneously, and/or the subspace capacitance matrix is obtained when a subspace includes a plurality of dielectric materials, each of the dielectric materials has a dielectric value, and the grid structure is formed along dielectric boundaries and the setting up is performed using each of the dielectric values.

An other aspect of the invention is an apparatus to determine a plurality of capacitance values for a group of interconnecting wires that interconnect a plurality of components with a plurality of conductor segments in a chip, using a data set comprised of technology data for the chip, geometry data for a first segment of the conductor segments and for a corresponding environment of the first segment; the apparatus including: a first processor for determining a parallel plate capacitance matrix, a frontal 2-dimensional capacitance matrix, a lateral 2-dimensional capacitance matrix and a wiring plane 2-dimensional matrix from the set; a second processor for merging the parallel plate, frontal, lateral and wiring plane matrices into a merged capacitance matrix; a third processor for extracting from the merged capacitance matrix a self capacitance value, and a plurality of values for a plurality of coupling capacitances between the first conductor segment and each of a plurality of other conductor segments defined in the environment data; and a storage system for storing the self capacitance value and the plurality of values.

BRIEF DESCRIPTION OF THE DRAWINGS

These and other objects, features, and advantages of the present invention will become apparent upon further consideration of the following detailed description of the invention when read in conjunction with the drawing figures, in which:

FIGS. 6, 6A, 6B show a flow diagram of the overall context in which the capacitance ascertainment process is used in an embodiment of the present invention;

FIGS. 8, 8A, 8B show a flow diagram of a 2-dimensional capacitance processor in the frontal plane in accordance with the present invention;

FIGS. 9, 9A, 9B show a flow diagram of a 2-dimensional capacitance processor in the lateral plane in accordance with the present invention;

DESCRIPTION OF THE INVENTION

The present invention provides a general method and apparatus for ascertaining the capacitances for arbitrary geometries. The technique is designed so that it can be effectively used to compute capacitances of interconnect wiring for chips. These capacitance values are used as the input for timing analysis, noise analysis etc. of the entire chip. Since wiring capacitances values are comparable to load capacitance values in high performance chips whose feature sizes are extremely small and which have to operate at extremely high speeds, fast and accurate extraction of these capacitance values is a crucial step in the design and analysis of these chips. To keep the number of determinations low, a combination of a group of 2-dimensional ascertainments is performed. The combination is multiplied by a length representing the third dimension to obtain the solution. This technique approximates a 3-dimensional processor using a combination of 2-dimensional determinations. It is herein referred to as the 2.5-dimensional processor. It is noted that in general 2-dimensional capacitances can also be determined in the wiring plane. However, since the wires are generally long, the fringe capacitances in the wiring plane are usually very small when compared to the total capacitance. Hence in an embodiment of the present invention, the 2-dimensional processors are not performed in the wiring plane. It is noted that the technique can easily be generalized to a mixture of 2-dimensional and 3-dimensional processors as well as to only 3-dimensional processors. Each component of the technique is implemented by an apparatus including a processor or processor element. Thus the word processor as used herein includes a processor or processing element.

Figure 1:
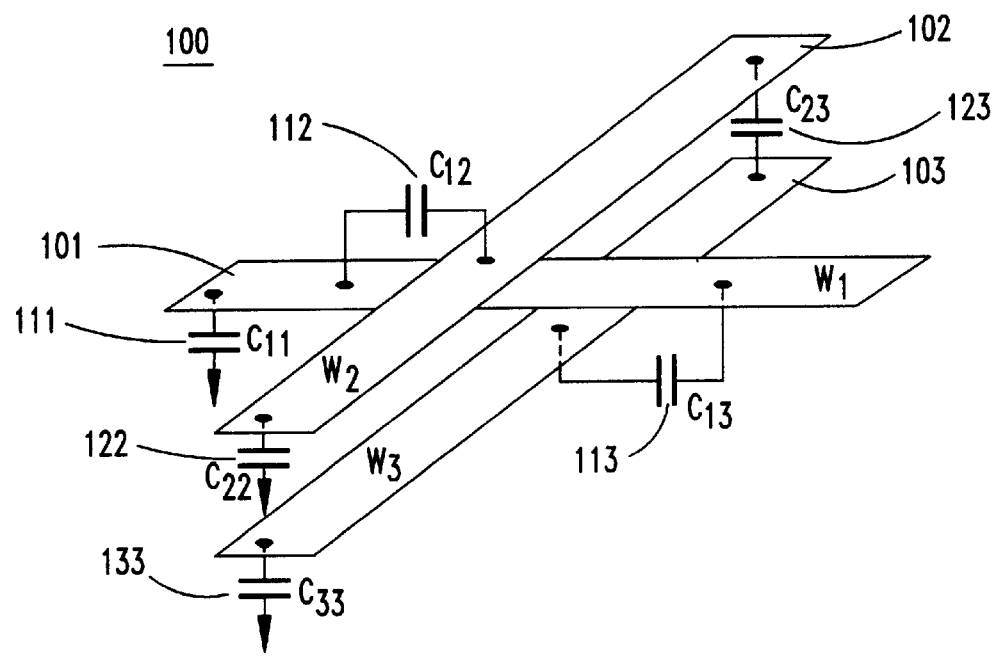
FIG. 1 shows an example geometry of a set of crossing wires and the capacitances that are typically required to be determined for such a geometry.
Figure 2:
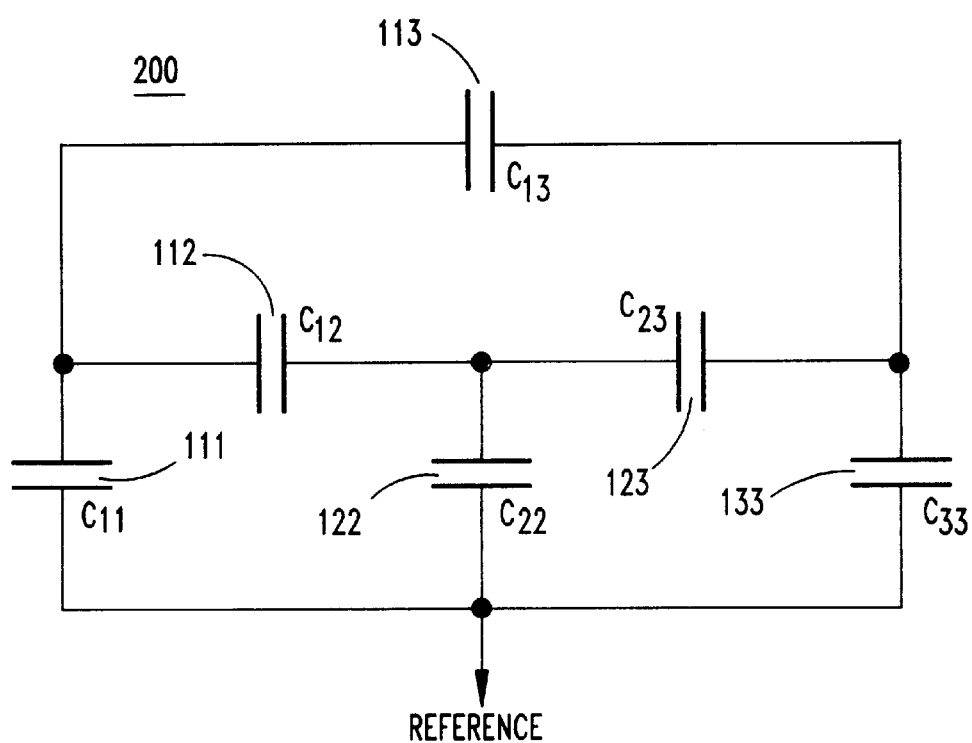
FIG. 2 shows the capacitances required to be determined and the equivalent circuit for the configuration of wires shown in FIG. 1.
Figure 3:
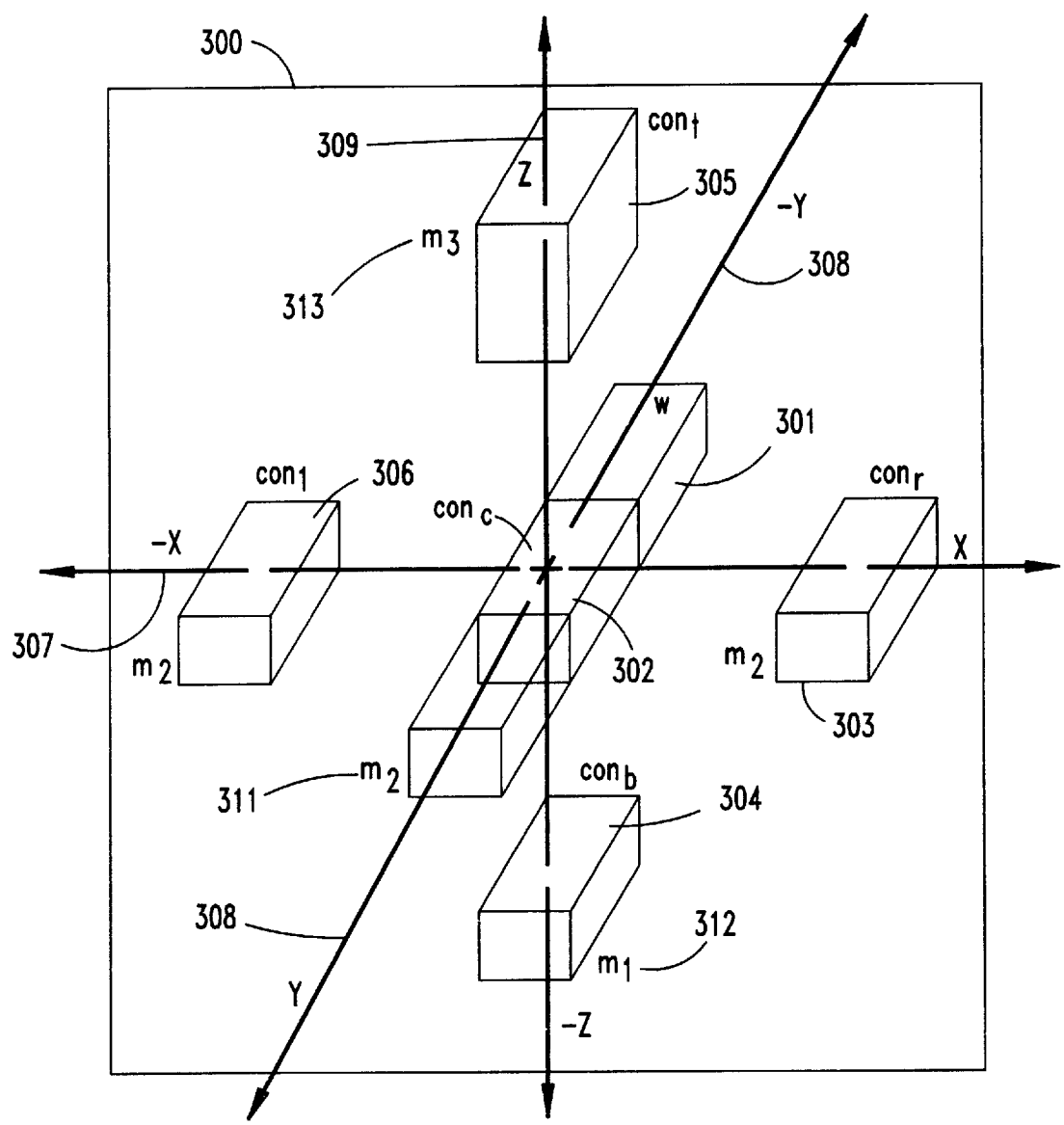
FIG. 3 shows an example of a conductor segment and its environment.
Figure 4:
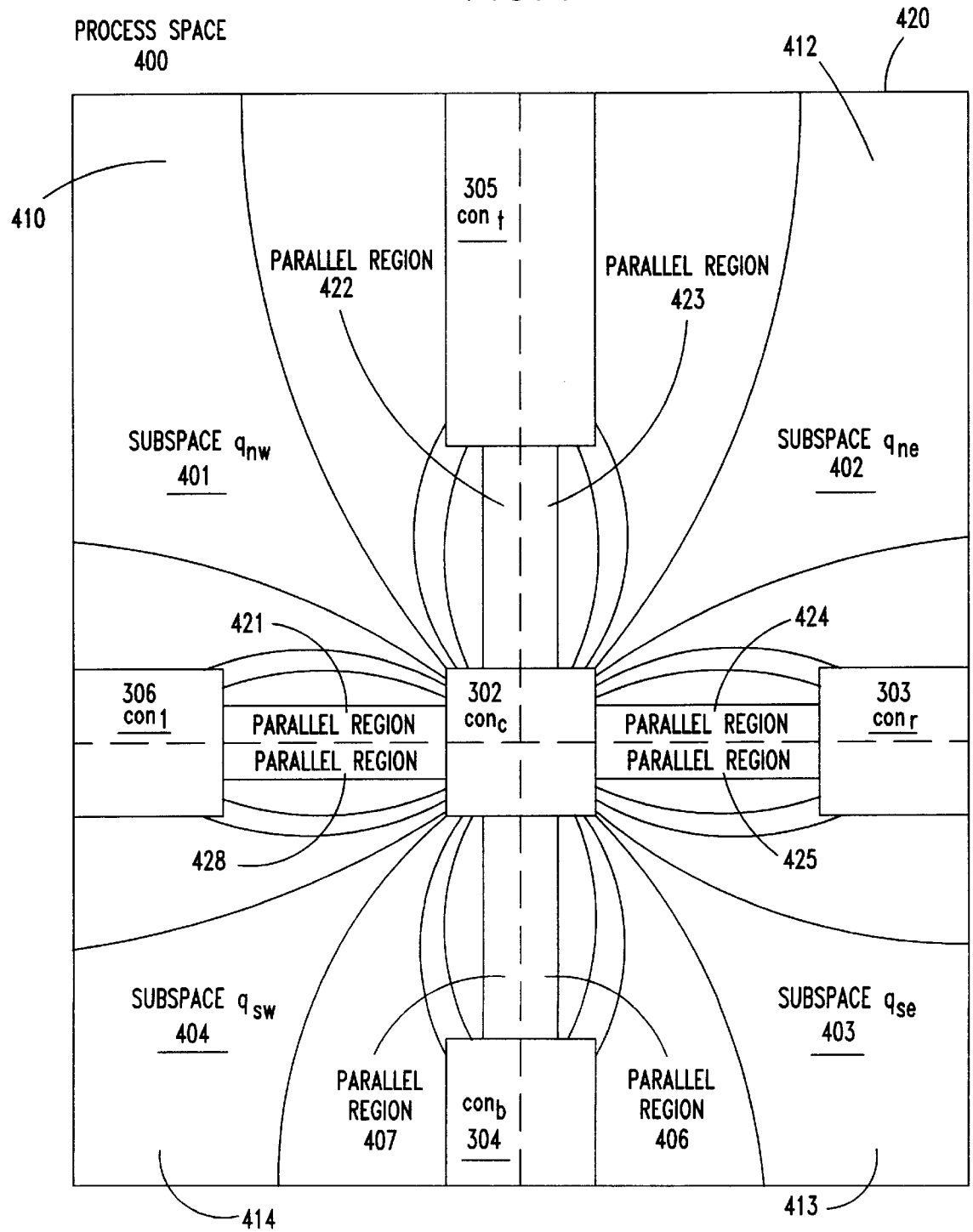
FIG. 4 shows a frontal cross-section of the decomposed geometry of FIG. 3

In an embodiment described herein, the 2-dimensional capacitances are determined separately in the frontal plane and the lateral plane to obtain the frontal and lateral 2-dimensional capacitance matrices respectively. The processors in the frontal plane are described in detail. Processing in the lateral plane is performed in similar fashion. A cross-section of the decomposed unit in the frontal plane is used in the frontal plane processors. FIG. 4 shows such a frontal cross-section for a decomposed geometry of FIG. 3. Conductor segments con$_t$ 306, con$_c$ 305, and con$_r$ 303, are located on a layer below conductor segment con$_t$ 305, and on a layer above conductor con$_b$ 304.

The area comprising the cross-section of the conductor segment and the portion of its environment that is within a region of influence in either the frontal plane, lateral plane, or the wiring plane is referred to herein as the processing space. Thus the 2-dimensional capacitance processors in any of these planes are performed within their respective processing spaces. A processing space comprises a conductor segment and its environment. The processing space in a plane is first partitioned into a set of processing subspaces also called subspaces. FIG. 4 shows the cross-section of the conductor segments in three metal layers for a processing space 400. The processing space 400 is bounded by the outer rectangle 420 which is partitioned into four subspaces 401–404 by the dashed horizontal and vertical lines passing through the center of conductor segment con$_c$ 302. The third dimension for all conductor segments is viewed when looking into the plane of the processing space 400. This is the direction in which conductor segments lengths are measured. The length value is determined by the distance to which the conductors run in parallel into the processing space 400 plane.

It is advantageous to divide the processing space 400 into rectangular subspaces. Thus, processing space 400 is divided into four subspaces. The subspace q$_{nw}$ 401 on the upper left northwest rectangle, subspace q$_{nw}$ on the upper right northeast rectangle, subspace q$_{sw}$ 403 on the lower right southeast rectangle, and subspace q$_{sw}$ 404 on the lower left southwest rectangle. Each subspace has a fringe region and two parallel regions. The subspace 'q$_{nw}$' 401 includes regions 410, 421 and 422 subspace 'q$_{ne}$' 402 includes regions 412, 423 and 424, subspace 'q$_{se}$' 403 includes regions 413, 406 and 425, and subspace 'q$_{sw}$' 404 includes regions 414, 407 and 428.

The 2-dimensional capacitances are determined per unit length and the values are then multiplied by the length of the conductor segment in the direction perpendicular to the plane of processing. The capacitance processing uses capacitance matrices determined independently for each of these subspaces and merged to obtain the subcapacitance matrix for the conductor segment. Determining the subcapacitance matrix for a subspace sometimes involves discretizing the subspace using a non-uniform rectilinear grid. The term discretizing is used herein to mean the subdividing or partitioning a space into smaller spaces.

Figure 5:
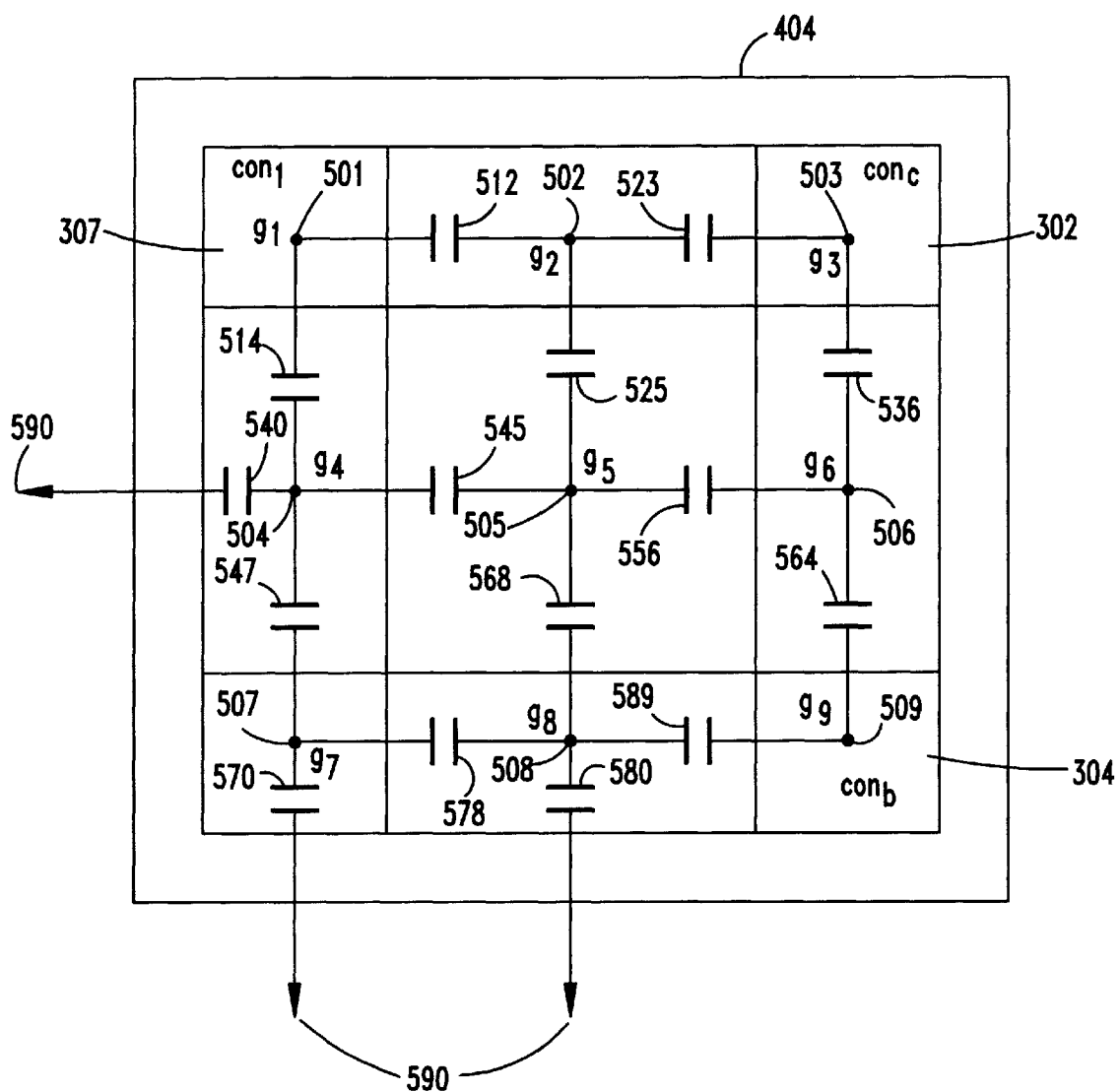
FIG. 5 shows a simple linear grid structure for the subspace of the processing space shown in FIG. 4.

FIG. 5 shows a very simple linear grid structure for the subspace 404 of the processing space 400 shown in FIG. 4. Grid nodes are labeled g$_1$–g$_9$, 501–509 and the capacitances between them 512, 514, 523, 525, 536, 545, 547, 556, 558, 569, 578 and 589 are shown in the figure. The capacitance c$_{ij}$, labeled '5ij', refers to the capacitance between grid elements g$_i$ and g$_j$. Some grid elements have a capacitance to ground. These capacitances 520, 540, 560, 570 and 580, model the field lines going to reference point 590.

An initial capacitance matrix is then set up for this grid structure using predefined templates and/or the parallel plate capacitance equation. This matrix is called the subcapacitance matrix. Each row of the subcapacitance matrix represents a grid element. Each column of the subcapacitance matrix represents a grid element. The value of capacitor C$_{ij}$ in row i and column j is the negative of the parallel plate capacitance value between these two grid elements. The parallel plate capacitance c between two adjacent grid elements is determined as c=εw/t, where ε is the permittivity of the material, w is the length of the boundary between the two grid elements, and t is the distance between the centers of the grid elements. The value c is the capacitance per unit length in the third dimension. The matrix entry c$_{ii}$ which is the diagonal element of the matrix in row i is the negative of the sum of all the other values in the row, added to an estimate of the capacitance between the grid element and the reference point. This estimate varies with the wiring density near the processing space and decreases with an increase in the density. A simple estimate is:

$$kw/(t/2)=2kw/t,$$

where k is the dielectric constant, w is the width of the grid elements common boundary with the region outside the processing space, and t is the thickness of the grid element. This particular estimate is useful when the wiring density is dense. The subcapacitance matrix is a symmetric positive definite matrix.

The process of discretizing the physical geometry into grid elements for which capacitances can be ascertained easily is described below. Using the above technique equations are set up for arbitrary geometries of the form $$-Q=CV$$

where; 'V' is a vector of voltages, in which each element v$_i$ is the voltage in the center of a grid element i, also called the nodal voltage for a node representing grid element i; 'Q' is a vector of charges, in which g$_i$ is the charge on the node corresponding to the grid element 'i'; and 'C' is the subcapacitance matrix. This equation is also called the capacitance matrix equation. Nodes that represent grid elements that are real conductors are called external nodes, and all other nodes are called internal nodes.

It is possible to obtain key insights by observing the behavior of the fields for exact solutions to the problem. In VLSI chips the conductors are relatively closely spaced and a certain regularity is often observed. The observation explained below, illustrates how processing spaces are partitioned to speed up processing after the processing space is partitioned into processing subspaces described above.

In an embodiment the partitioning is done along flux lines between conductors. Flux lines located near the center of the conductor face are usually straight and parallel to each other. These are convenient lines along which to partition the processing space. Partitioning into subspaces is a key tool used to reduce processing time as it speeds up the Gaussian Elimination step performed later. Further, in most cases, results of processing for a subspace can be reused during determinations for an adjacent processing space. However, it is noted that partitioning into subspaces is desirable even if it is not done along field lines.

An embodiment makes use of the observation that there are regions between conductors where the field lines are parallel. In these areas, processing can be further simplified and speeded up. The space between two conductors has a region where the field lines are parallel. This entire region, herein referred to as being a parallel region, may be represented by a single parallel plate capacitance. Such a region covers a large part of the smaller of the conductor widths of two conductor surfaces that face each other. Since parallel regions need not be divided, processing in this area is considerably simplified. The region where field lines are not parallel to each other is referred to herein as the non-parallel region or the fringe region. An example showing these regions is illustrated in the flux lines for the processing space in FIG. 4. As shown in FIG. 4, each of the subspaces includes two parallel regions and one fringe region. The parallel regions are shown marked in the figure. Thus, techniques based on the two observations described, can be used to partition a complex geometry into a set of simpler geometries. An efficient grid structure can be set up for each subspace obtained by partitioning and the capacitance matrix equation can then be set up for this grid structure.

The present invention includes a method of reducing the capacitance matrix equation to obtain self and coupling capacitances. In the first type of reduction, called reduction $R_1$, all rows and columns that represent nodes that lie on an equi-potential surface, or on the same conductor segment, are replaced by one row and one column in the matrix. This is achieved in two steps. In the first step, a new row is obtained by vector addition of all rows that correspond to nodes on an equi-potential surface. It is noted that simple vector addition of the vectors is possible since each value represents a capacitance in parallel with another capacitance. The equivalent capacitor of two parallel capacitors is the simple addition of the two capacitances. All the rows corresponding to nodes on the equi-potential surface are replaced by this new row. In the next step a new column is obtained by a vector addition of all the columns that represent nodes on the equi-potential surface. All columns corresponding to nodes on the equi-potential surface are replaced by this new column. Because of reduction $R_1$ one unknown replaces many unknown voltages that correspond to the conductor being considered which is on an equi-potential surface in the subcapacitance matrix equation. This step is repeated for all conductors with multiple nodes in the subspace.

In the second type of reduction, called reduction $R_2$, all internal nodes in the grid are eliminated by Gaussian Elimination as known to those familiar to the art. This results in having only rows and columns corresponding to the external nodes remaining in the matrix.

As mentioned earlier, it is advantageous that the processing space be partitioned along field lines, ensuring that no field line crosses over from one partition to another. For each conductor segment it is necessary to obtain the values of self capacitances, and of coupling capacitances with each of the other conductor segments in its environment. All corresponding capacitance values determined for each partitioned subspace are simply added. Such a simple merge process is possible whenever the subspaces are fully decoupled.

Arbitrary partitions can in fact be introduced in any of the processing spaces as long as an appropriate interface is provided to merge the results of the capacitance processing for the subspaces resulting from such a partitioning. While the general structure of the VLSI wiring usually has quite a lot of regularity, there are situations where several of the conductors may be missing. In this situation, partitioning along field lines may not be practical. With the subcapacitance approach, subdivision lines can be introduced in arbitrary places. However, it is noted that in this circumstance, the simple decoupled subspace models that result from partitioning along field lines is not obtained. This often requires the use of more complex processes for merging intermediate results obtained from processing on the subspaces.

When an arbitrary subdividing line is used to partition a processing space in order to simplify the subcapacitance matrices generated and/or for other reasons like the reuse of subspaces, terminal nodes are defined at the subspace interfaces. These nodes are treated as external nodes for processing purposes within the subspace, even though they do not correspond to nodes representing conductors. The final capacitance values are obtained for the set of joined subspaces by Gaussian Elimination of the interface nodes. This approach allows for processing spaces to be partitioned in a way that predetermined capacitance matrices are available for reuse for most of the subspaces.

Another key capacitance issue is the grounding of conductors. Typically, the processing of the capacitance of a conductor segment is of particular interest when all other conductor segments in its environment are grounded. Since no assumption regarding the grounding of any conductor has been made in the formulation of the problem, there is complete flexibility in choosing any conductor to be grounded. Once grounded nodes are selected, the rows and columns of the capacitance matrix that correspond to the grounded nodes are removed, by Gaussian Elimination.

Coupling capacitances also referred to as mutual capacitances, are easily determined from the formulation with little additional processing. All rows and columns corresponding to nodes representing grounded conductors are first eliminated leaving only ungrounded conductors in the matrix. Coupling capacitance between a particular conductor-$c_0$ and another conductor-$c_1$ in conductor-$c_0$'s environment, is simply the negative of the value in the row corresponding to the node representing conductor-$c_0$ and the column corresponding to the node representing conductor-$c_1$. It is noted that in a realistic situation of chips with multiple layers, many of the coupling capacitances are small. This is because coupling in VLSI geometries is generally very local.

Changes in dielectric constants for different layers are handled by partitioning along the dielectric boundaries.

In an alternate embodiment, the changes are handled by ensuring that the grid structures within a partition are formed along dielectric boundaries. In this situation, the parallel plate values used in generating the capacitance matrix use the different values of dielectric constants based on the dielectric of the grid element for which the processing is being made.

A similar technique is used to account for the air space above the VLSI structure. Accounting for this space is by modeling field lines that extend to a reference point above the VLSI chip. This is accomplished by using a finite number of grid elements to model this region in a way that the grid element size increases rapidly as the distance of the grid element from the conductor segment increases.

It is important to note that the basic subcapacitance methods presented in the faster 2.5-dimensional approach are applicable to full 3-dimensional models as well.

DETAILED DESCRIPTION OF THE INVENTION

Figure 6B:
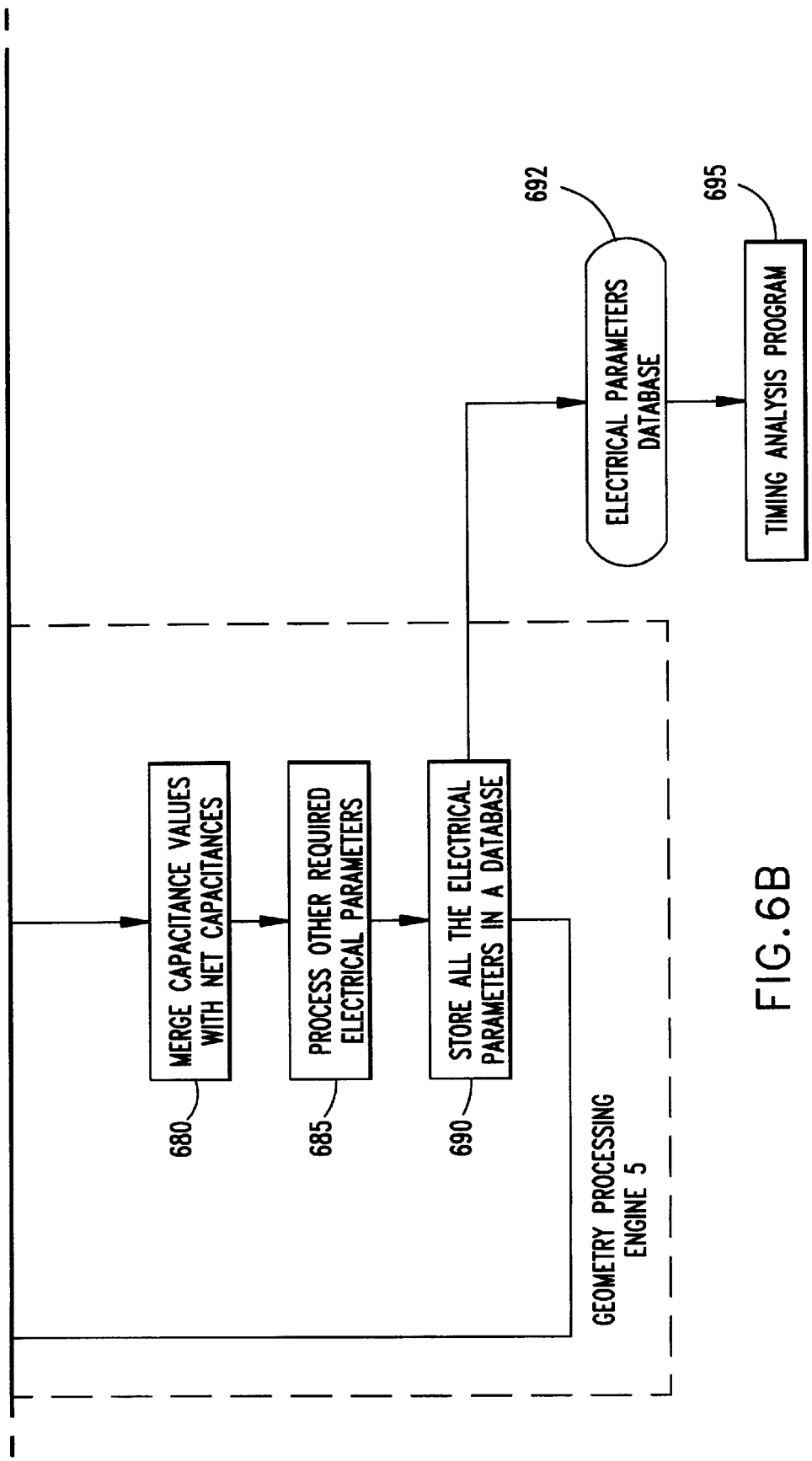

Actual implementation of the method of the present invention makes use of the "Capacitance Determination" (CD) processor. It is one form of a processor for ascertaining capacitances, and is herein henceforth referred to as the CD processor. The processor is described using the flow diagrams shown in FIGS. 7, 8, 8A, 8B and 9, 9A, 9B. The flow diagram in FIGS. 6, 6A, 6B provide the overall context in which a CD processor is used. A description explaining the steps shown in the flow diagram of FIGS. 6, 6A, 6B are provided, and is followed by a detailed explanation of the CD processor.

The inputs required for use of the CD Processor are described. The numbers in parentheses next to each item in the descriptions show the corresponding block in the flow diagrams. Referring to FIGS. 6, 6A, 6B, one required input is the wiring geometry 605). This data is typically obtained from a database generated by a VLSI layout program, by a design entry system, a combination of the two, or another system. This data contains information about widths, lengths, and sometimes the thickness of the wires that interconnect the various devices in the VLSI chip. Information about the devices may also be present in a database from which it is retrieved.

Another required input is the program control data for the geometry engine 610). Program control data refers to a user input that directs the program operation. For example, it may specify that only a portion of the VLSI geometry be analyzed.

The main loop in a geometry processing engine 600 that makes use of the subcapacitance processor, starts with the step to process the geometry and get a next conductor segment 615. After reading the wiring geometry, the geometry processing engine typically decomposes it using a technique like a scan line processor. In each step of the processing, the program processes a conductor segment that was not processed if such a conductor segment exists. Next a check is made to determine the existence of another conductor segment which was not yet processed 620. If no more conductor segments exist 625, then the program is ended 630. If there is a conductor that is not yet processed 635, then the processor generates the spatial environment of that next conductor segment 640. The system determines all the conductor segments that are neighbors of this next conductor segment, in each of the three dimensions. A detailed explanation of this input is provided in the description of the flow diagram of FIG. 7.

It then calls the CD processor 645. In this step the program ascertains the self capacitance of the conductor segment and the coupling capacitances of the conductor segment with other conductor segments in its environment using the CD processor 660. It then merges 680 all capacitance values in the output 675 of the CD processor with the capacitance values of the corresponding net. First the self capacitance of the particular conductor segment is added to the self capacitance of its corresponding net. Next the coupling capacitances of the particular conductor segment with each of the conductor segments in its environment, is added to the coupling capacitance of the net pair to which the conductor segments belong. Coupling capacitances are updated in this manner for each net pair ($n_o$, $n_i$) where '$n_o$' is the net corresponding to the particular conductor segment being considered, and $n_i$ is the net corresponding to a conductor segment in its environment.

The system proceeds to determine any other required electrical parameters 685. These parameters could be resistances, inductances, etc. It then stores the electrical parameters in a data base 690. The electrical parameters determined so far for any complete net are stored in a database and/or are passed directly to the timing analysis program 695. Often an electrical parameters database 692 is employed to pass the data to the timing analysis program 695 for further processing. The analysis program determines the timing parameters of the chip for cycle time determination.

Analysis programs are typically timing programs and noise analysis programs. The electrical parameters like capacitances and resistances computed for the interconnect wiring are used in conjunction with the load capacitances to perform a timing analysis of the chip. Analysis programs may typically use model reduction during analysis. The system returns to step 615 to process the next conductor segment. It determines the existence of another conductor segment 620. If none exists 625 it ends 630. This stops the program when there are no more conductor segments left to be processed.

In step 660 of FIGS. 6, 6A, 6B, the CD processor was used to determine the capacitance matrix for a given conductor segment and its environment. An expanded flow diagram of the steps of the CD processor is provided in the flow diagram in FIG. 7. Inputs to the CD processor include the results 650, of step 645, of FIGS. 6, 6A, 6B, the technology data 655 provided from an external function, and the program control data 665. The output 650 of step 645 becomes the geometry input to the CD processor 660. This input is generated by a geometry processing program which provides the geometry data of the particular conductor segment being examined (also called the conductor segment data), and the geometry data of all the other conductor segments in its environment (also called the environment data corresponding to the conductor segment data). The environment is the particular conductor's region of influence. In one embodiment this is a set of immediate neighbors of the said conductor segments. The geometry of a conductor segment refers to the width, length, and possibly the thickness of the conductor segment. The geometry of the environment refers to the geometry of all conductor segments in the environment as well as their locations with respect to the particular conductor segment being examined. This data is also called the conductor segment data and its corresponding environment data.

The technology data 655 is technology dependent. Many geometric parameters are based on the VLSI technology used to fabricate the chip. Data obtained from the particular technology specifications includes: the number of metal layers; the thickness of the dielectric between the various metal layers; nominal widths; the tolerances on the widths for all wires in the various metal layers; and the values of dielectric thickness between each metal layer and the substrate. (This value is used when there is no conductor segment below the said conductor segment); the values of dielectric thickness above each metal layer on the VLSI chip. (This thickness is used when there is no conductor segment above the said conductor segment); one or more values of permittivity of the dielectric between the metal layers; the minimum and nominal distance (pitch) between wires in a given metal layer, and other such data relevant for capacitance ascertainments. This data is generally available in manuals describing the interconnect technology employed in the design. Any of several available technologies may be employed, including: spin on glass fully etch back process; chemical mechanical polish; chemical vapor deposition process; plasma enhanced chemical vapor deposition process; and others.

Another input to the CD processor is the program control input 665. This input provides user control of the processor. It controls the coarseness or fineness of the grid structure both near conductor segment corners as well as in regions of sparse field lines. This input also determines the speed versus accuracy trade off used by the program, which is another advantage provided by the present invention. It also controls the distances from a conductor segment for which the environment is to included in the processing space.

Figure 7:
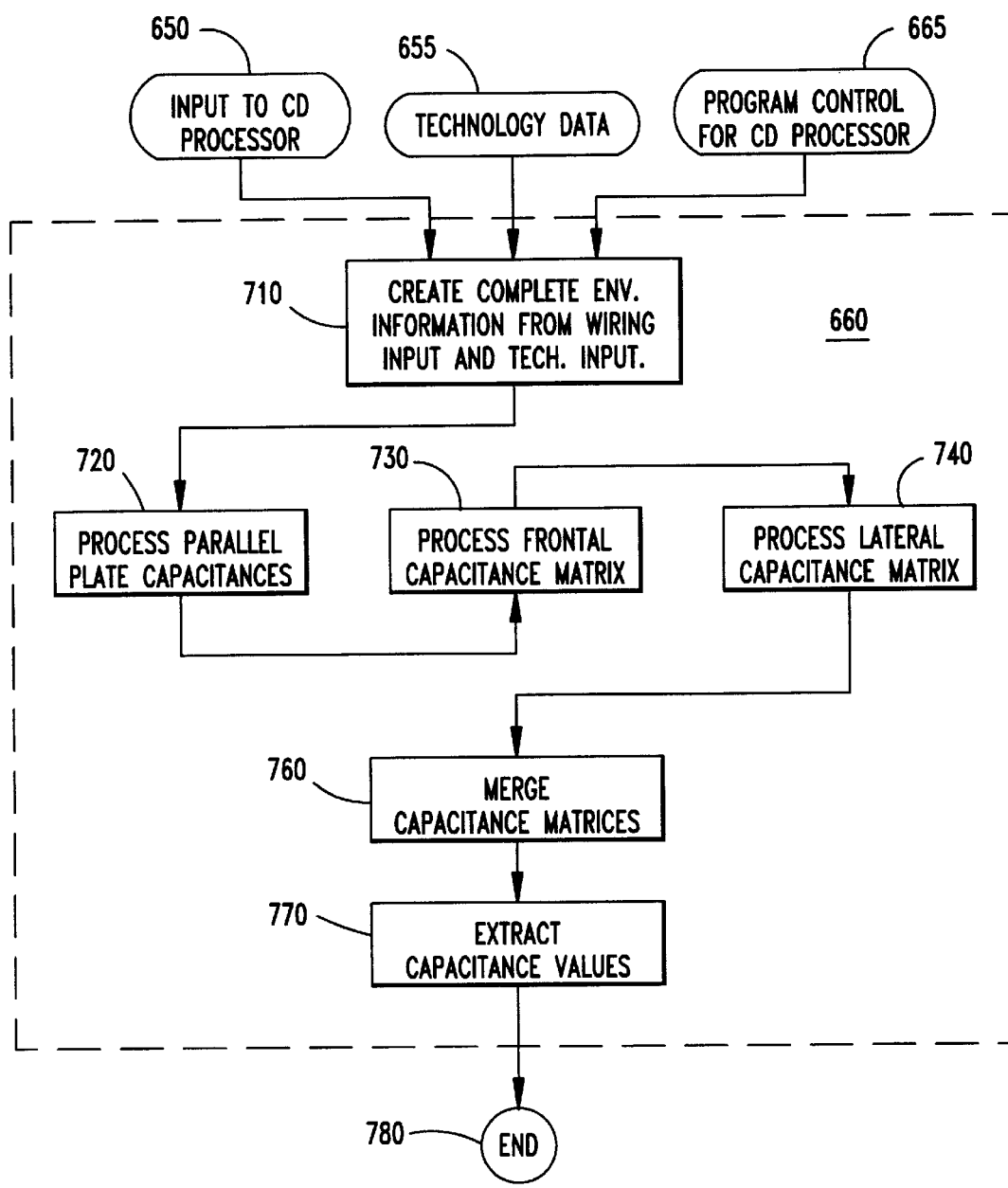
FIG. 7 shows an expanded flow diagram of the steps of the CD process in accordance with the present invention.

The CD processor operates, as shown in FIG. 7. It processes 710 the wiring input 650 and technology data 655 to generate the complete environment of the conductor segment. It uses this data to determine the parallel plate capacitance 720 for parallel field lines in the via direction. This is the capacitance between conductor segment-c and the conductor segment above and below segment-c. The capacitance is due to the field lines in the parallel region between them. After the values are determined, these values are entered into a capacitance matrix $RM_{pp}$. In the example of FIG. 3 this is the capacitance due to parallel field lines between conductors $con_c$ and $con_t$, and between $con_c$ and $con_b$. This is also the same as the parallel plate capacitance due to the parallel regions 406, 407, 422, and 423 in FIG. 4. The matrix $RM_{PP}$ for the example of FIG. 3 would have a form as follows:

$$RM_{PP} = \begin{array}{c} \\ \\ \\ \\ \\ \\ \end{array} \begin{array}{cccccc} con_c & con_t & con_b & con_1 & con_r & \\ cp_{ct}+cp_{cb} & -cp_{ct} & -cp_{cb} & 0 & 0 & con_c \\ -cp_{ct} & cp_{ct} & 0 & 0 & 0 & con_t \\ -cp_{cb} & 0 & cp_{cb} & 0 & 0 & con_b \\ 0 & 0 & 0 & 0 & 0 & con_1 \\ 0 & 0 & 0 & 0 & 0 & con_r \end{array}$$

where the parallel plate capacitances due to the parallel regions between conductors $con_c$ and $con_t$ is $cp_{ct}$ and that between $con_c$ and $con_b$ is $cp_{cb}$. The rows and columns of the matrix are labeled based on the conductor segment to which they correspond.

Figure 8B:
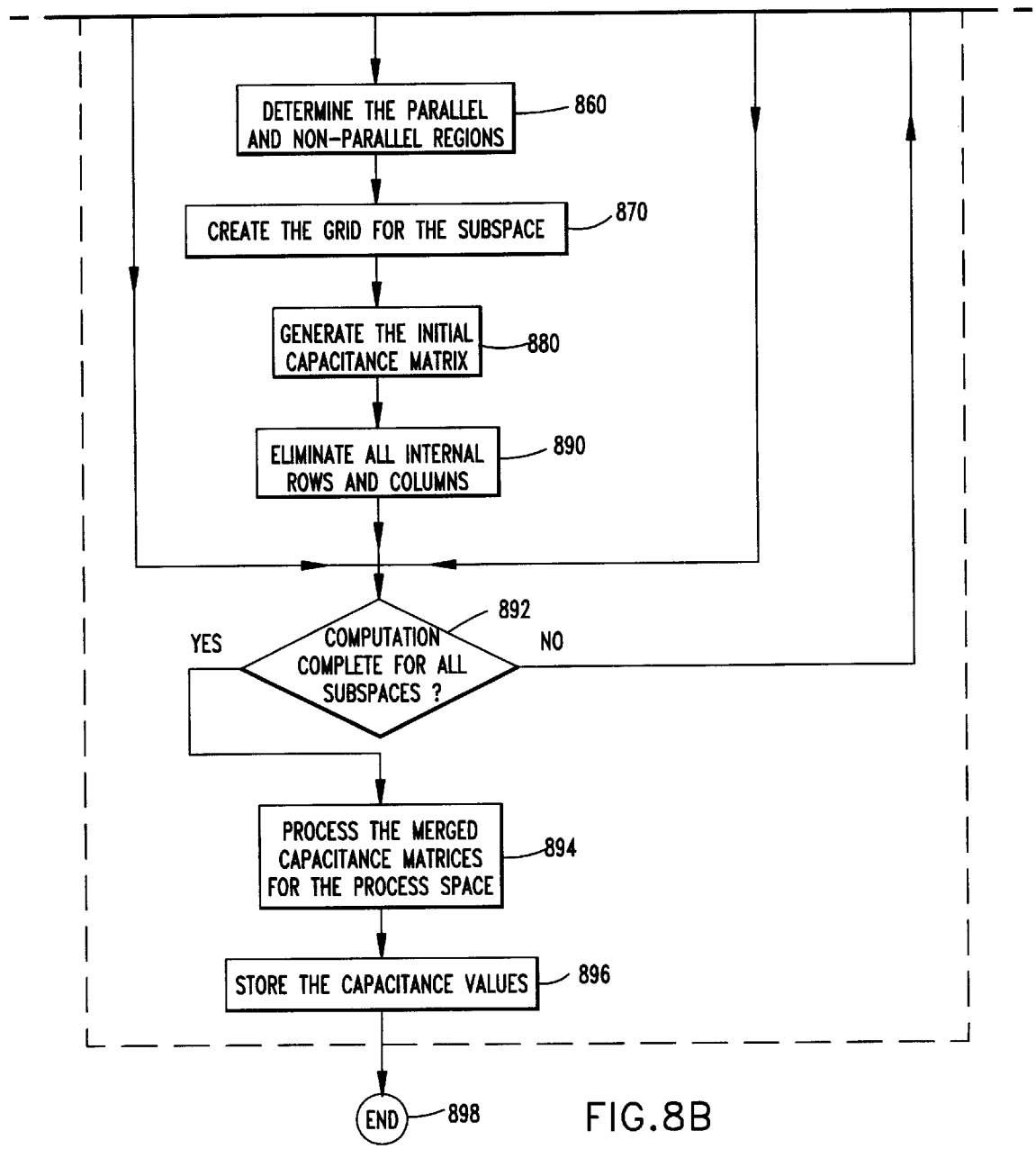

The frontal capacitance matrix is determined 730. This determination requires the 2-dimensional capacitance processor in the frontal plane shown in FIGS. 8, 8A, 8B. FIGS. 8, 8A, 8B are an expansion of the frontal capacitance matrix block 510. The resulting frontal capacitance matrix generated is referred to as $RM_{XZ}$. For the example of FIG. 4 would have a form such as:

$$RM_{XZ} = \begin{array}{cccccc} con_c & con_t & con_b & con_1 & con_r & \\ cf_c & -cf_{ct} & -cf_{cb} & -cf_{cl} & -cf_{cx} & con_c \\ -cf_{ct} & cf_t & -cf_{tb} & -cf_{tl} & -cf_{tx} & con_t \\ -cf_{cb} & -cf_{tb} & cf_b & -cf_{bl} & -cf_{br} & con_b \\ -cf_{cl} & -cf_{tl} & -cf_{bl} & cf_1 & -cf_{1r} & con_1 \\ -cf_{cr} & -cf_{tr} & -cf_{br} & -cf_{1r} & -cf_r & con_r \end{array}$$

where:

$cf_c > cf_{ct} + cf_{cb} + cf_{cl} + cf_{cr}$, $cf_t > cf_{ct} + cf_{tb} + cf_{tl} + cf_{tr}$, $cf_b > cf_{cb} + cf_{tb} + cf_{bl} + cf_{br}$, $cf_1 > cf_{cl} + cf_{tl} + cf_{bl} + cf_{1r}$, and $cf_r > cf_{cr} + cf_{tr} + cf_{br} + cf_{1r}$.

Simultaneous with, before, or after the frontal capacitance processing, the lateral capacitance matrix is determined 740. This processing requires the 2-dimensional capacitance processing in the lateral plane following the flow diagram in FIGS. 9, 9A, 9B. The resulting lateral capacitance matrix generated is referred to as $RM_{YZ}$. Since all the wires extend on both sides in the frontal (Y) direction, the matrix $RM_{YZ} = \psi$ Once the parallel plate, frontal and lateral capacitance matrices are determined, they are merged to form the merged capacitance matrix 760. Merging the matrices $RM_{PP}$, $RM_{XZ}$, and $RM_{YZ}$ involves simple addition operations. Because all these capacitances are in parallel with each other, the self and coupling capacitances between the same conductor segments in all three matrices are merely added in this merge process. The resulting matrix is referred to as the merged capacitance matrix, RM. Either one or both of the matrices $RM_{XZ}$ and $RM_{YZ}$ could turn out to be null matrices for a particular conductor segment. The total capacitance matrix for the example of FIG. 3 is simply the matrix sum of $RM_{PP}$ and $RM_{XZ}$.

The segment capacitance values are extracted from the RM 770. The coupling capacitance between a conductor segment-c and a conductor segment-$c_1$ is the negative of the value in the row corresponding to segment-c and column corresponding to segment-$c_1$. The self capacitance of a conductor segment-c is simply the sum of all the values in the matrix RM corresponding to segment-c. The values of these capacitances are stored for use in the particular modeling application, and the CD processor is ended 780.

The flow diagram of FIGS. 8, 8A, 8B show the 2-dimensional capacitance processing in the frontal plane. Similarly, the processing in the lateral plane is shown in FIG. 9. Since these processes are part of the CD processor their inputs are the same as that for the CD processor.

The following is an embodiment showing the steps used to determine the frontal 2-dimensional capacitance processing. Referring to FIGS. 8, 8A, 8B, the processing space is determined from the input geometry data 805. Based on the geometry of the conductor segment-c and its environment, a processing space is determined for a cross-section of segment-c in the frontal plane. A desirable processing space is the region that encloses the conductor segment-c's segment, and all other conductor segments in segment-c's environment. If the neighboring conductor segments are very long, the processing space is restricted by restricting the length to be based on the width of the dielectric between this long conductor segment and segment-c. A preferred length is one equal to the width of the dielectric. This is done so as to limit the size of the processing space.

The processing space is divided into subspaces in the frontal plane 810. This is accomplished in one of several ways. A desirable way is to use vertical and horizontal lines passing through the center of the conductor segment. In this way, the processing space is divided into four rectangular quadrants resulting in four subspaces.

Each of the subspaces is processed either simultaneously or in order 820. It is advantageous that the geometry engine be tightly coupled with the capacitance determining processor. This enables the use of previously determined information. It is particularly efficient when care is taken that conductor segments are handled in an appropriate (or tightly coupled) order.

This is herein referred to as tight coupling. If tight coupling is not possible, then step 830 is skipped. In this case the subspace data from step 720 is directly transferred to step 840 when pattern matching (step 840) is used, or directly to step 860 if pattern matching is not used. Step 840 performs the herein called 'pattern matching process'. The pattern matching process determines if a process can be avoided for a subspace by using a predetermined values. Whenever possible it is advantageous to use a library of conductor segment and environment topologies. Their corresponding capacitance matrices and the pattern matching process is explained subsequently. If pattern matching is not performed then steps 840 and 850 are skipped, and control is transferred to step 860.

When pattern matching is used, a check is made to determine if the present subspace geometry matches a predetermined geometry 840. This occurs when the geometry of the subspace being determined matches the geometry for a subspace for which capacitance values have already been predetermined. If yes, go to Step 850, otherwise go to Step 860. A match occurs when the geometries of the conductor elements match and have a same spacing between them. If a match is found then the capacitance matrix is set equal to the predetermined matrix 850. The capacitance matrix for the subspace is set to be that of the predetermined value and continues with step 892.

If there is no match, 840 then the parallel and non-parallel regions are determined 860. In the next part of Step 860 the parallel region not parallel to the via direction (Z-direction) is treated as a parallel plate capacitance and the capacitance value is determined accordingly for this region. In the example of FIG. 4, the parallel region 428 would be treated this way when processing the subspace 404. Note that the parallel region 407 for the subspace 404 is processed in Step 720 of the processor. A non parallel region is first divided into a grid in Step 870. In a desirable implementation this grid is non uniform. It is finer near the corners of conductor segments than at non corners. This is because flux lines are denser near the conductor corners. The grid is divided in accordance with parameters specified by the user.

An initial capacitance matrix is generated 880 by making an entry $c_{ij}$ in row-i, representing grid element-i, and column-j representing grid element-j, is simply the negative of the parallel plate capacitance between grid element-i and element-j if they are adjacent to each other, and zero otherwise. The value $c_{ii}$ is the negative of the sum of all the values in row-i added to an estimate of the capacitance due to field lines from the grid element-i to infinity. Note that the resulting matrix generated is symmetric and positive definite. Rows and columns representing grid elements on a conductor segment's surface are marked as being external and the rest are marked as being internal.

Then all internal rows and columns are eliminated by using Gaussian Elimination 890. All rows and columns in the matrix obtained after Gaussian Elimination correspond to a conductor segment. In the next part of this step the parallel plate capacitance determined in Step 860 is added to the corresponding value in the reduced matrix, also called the subspace capacitance matrix.

A check is made to determine if the process is complete for all subspaces 892. If the process is not complete for all subspaces, then steps 820 to 892 are repeated to complete the processing of the subspace capacitance matrices for all next subspaces. When all processing is completed the merged capacitance matrix is determined for the entire processing space 894. The 2-dimensional capacitance matrix and the parallel plate capacitances determined for all the subspaces are merged to obtain a capacitance matrix RM for the entire processing space. The capacitance values are used to determine the self and coupling capacitances from the capacitance matrix RM. These capacitance values are stored as desired 896 and the processing ends 898.

Figure 9B:
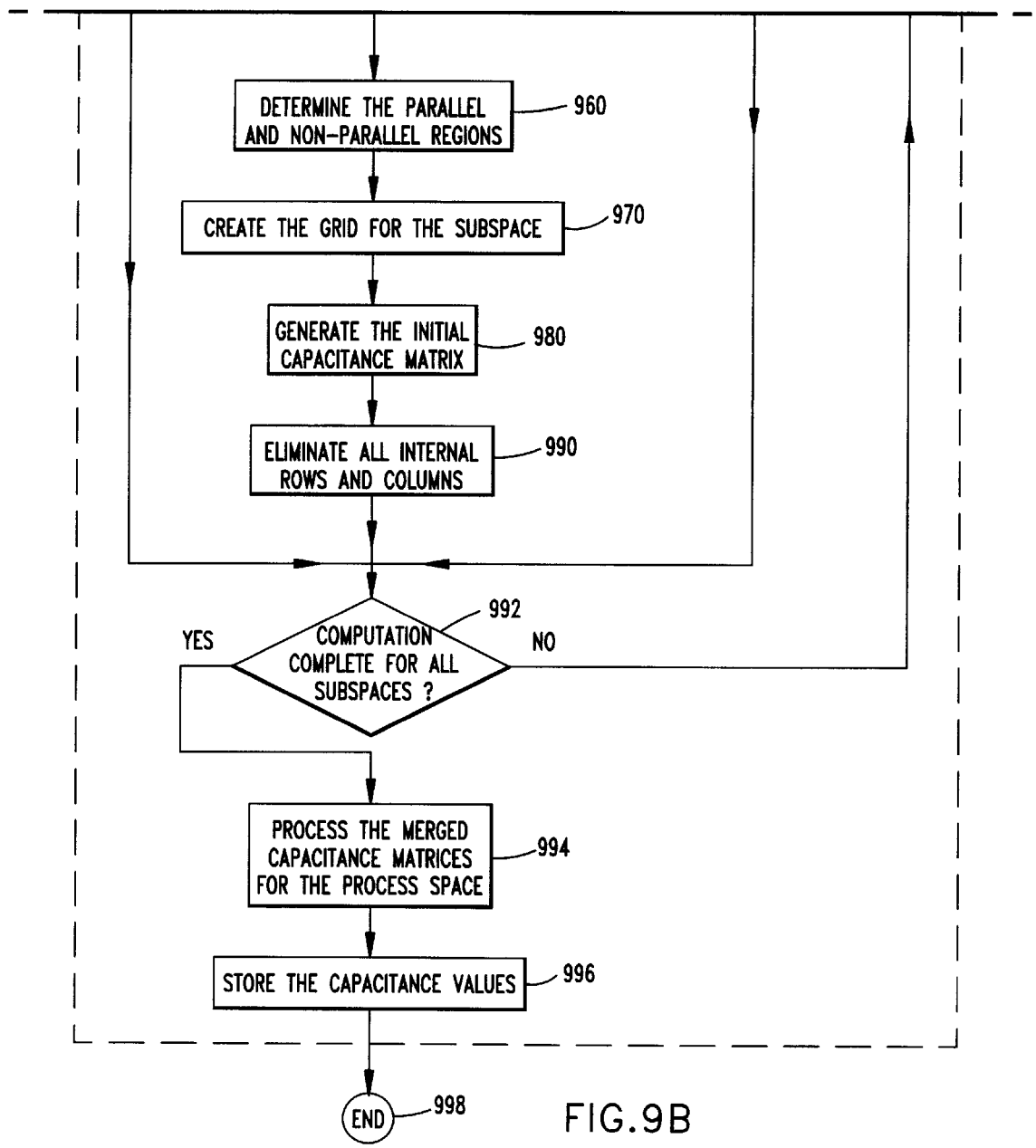

The flow diagram in FIGS. 9, 9A, 9B show the 2-dimensional capacitance processing in the lateral plane. This process is also a part of the CD processor, and hence its inputs are the same as that for the CD processor. The flow diagram in FIGS. 9, 9A, 9B operate in a identical fashion to the flow diagram in FIGS. 8, 8A, 8B. In a preferred implementation, the processors of FIGS. 8, 8A, 8B and 9, 9A, 9B are indeed combined into one. All the blocks in FIGS. 9, 9A, 9B that are designated with a number in the 900's correspond with the like blocks in FIGS. 8, 8A, 8B that have designation in the 800's in FIGS. 8, 8A, 8B. The final output obtained from the CD processor includes the self capacitance of the conductor segment and the coupling capacitances between the particular conductor segment and the other conductor segments in its environment.

It is noted that VLSI interconnect wires are normally laid out in very regular structures. This allows use of the tight coupling option of the present invention. In this option the processing time can be reduced considerably by recognizing this fact and performing 2-dimensional processing only when necessary. Based on the technology data like wiring pitch etc. a library of geometric patterns along with their predetermined capacitance matrices is first formed. This predetermination could be based on an accurate processor such as a field solver since the number of patterns for which such determinations are required are very small. Before performing an actual 2-dimensional capacitance processing for a subspace the pattern corresponding to the subspace is compared with the patterns in the library. If a match is found then the predetermined library capacitance matrix is used and no further processing is performed for that subspace.

In a desirable implementation, the patterns in the library are categorized and ordered according to geometric properties of the conductor segments in the subspace, and according to the geometry of the space between them. Capacitance matrices are predetermined for these subspaces using field solvers in a manner known to those familiar with the art, and stored along with the subspace itself in a library. The library may be organized as a height balanced search tree, based on the geometric characterization so as to enable a fast search of the library.

Figure 10A:
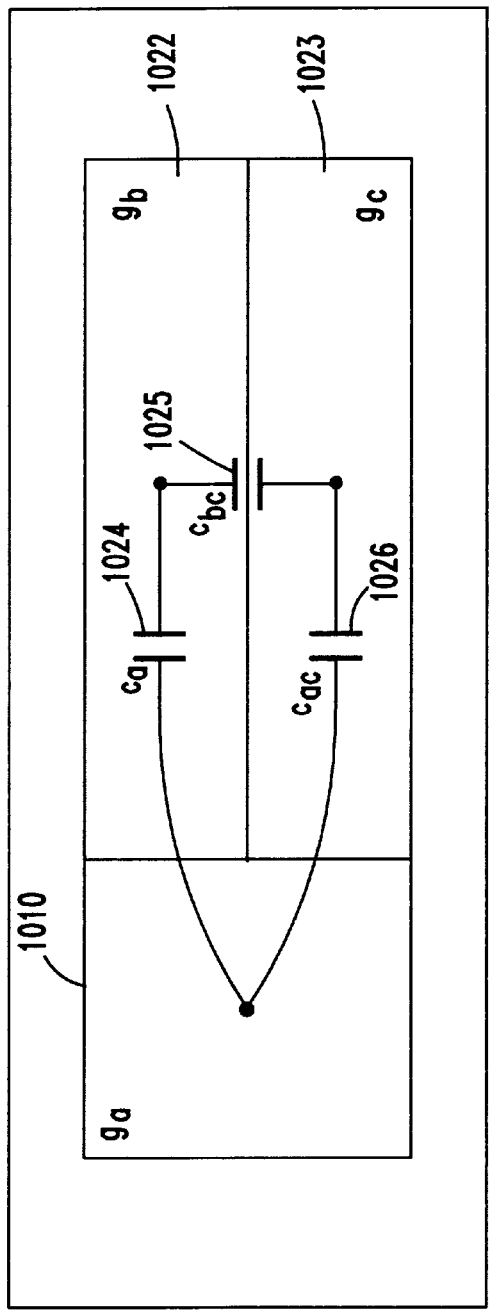
FIG. 10(a) shows an embodiment of the present invention for grid discretization done in a way that reduces the number of grid elements.
Figure 10B:
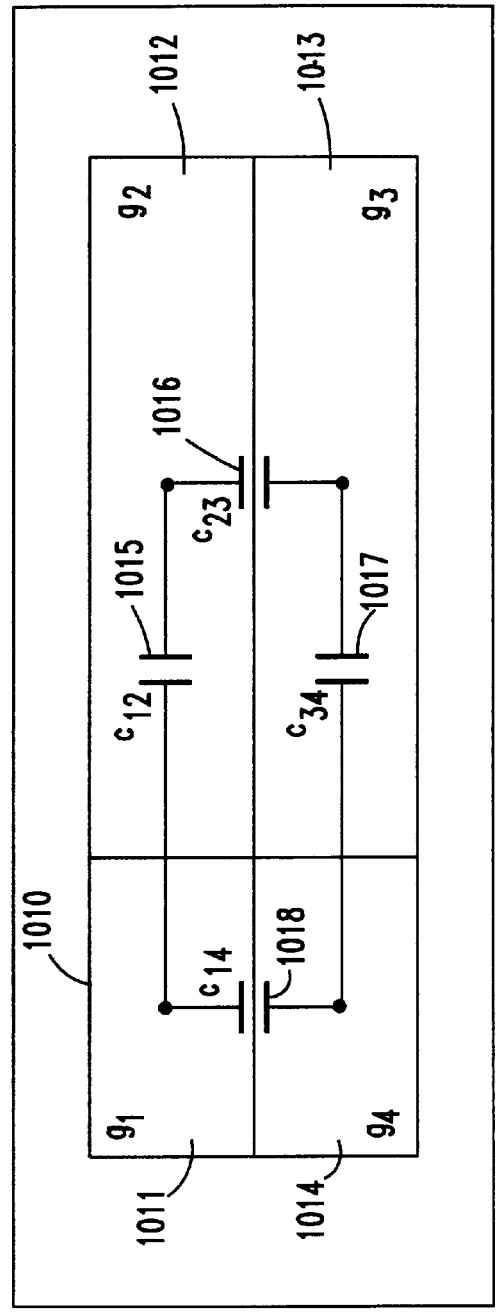
FIG. 10(b) shows a resulting rectilinear grid of the grid shown in FIG. 10 in accordance with the present invention.

There are other ways to speed up the processes in the 2-dimensional capacitances. For example, grid discretization could be employed in such a way that the number of grid elements is reduced. FIGS. 10*a*, 10*b* show two ways in which a region 1010 is divided into a grid. In FIG. 10(*a*) the region 1010 is divided into four grid elements 1011, 1012, 1013, and 1014. In FIG. 10(*b*) the same region 1010 is divided into three grid elements 1021, 1022, and 1023. The capacitance between the grid elements in FIG. 10(*a*) can be easily determined using the parallel plate formula as explained earlier. However, to use the grid structure of FIG. 10(*b*), closed form formulae for the capacitances $c_a$ 1024, $c_{bc}$ 1025 and $c_{ac}$ 1026 need to be determined in terms of the geometry. It is desirable to use the grid structure of FIG. 10(*b*) especially in regions where the field lines are sparse since it has fewer grid elements. By determining closed form formulae for the capacitances of such grid structures, and discretizing the subspace using such special grid structures, the size of the matrix on which Gaussian Elimination needs to be applied can be reduced considerably. This leads to a speedup of the CD processor. Such closed form formulae can be obtained for many special grid structures that could be used in discretization of the subspace. A method to determine the closed form formulae for the example of FIG. 10 is described below.

Closed form formulae for capacitances $c_a$ 1024, $c_{bc}$ 1025, and $c_{ac}$ 1026 are obtained as follows. In this example grid elements $g_2$ 1012, $g_3$ 1013, $g_b$ 1022, and $g_c$ 1023 are of the same length l, and same width w/2, respectively. The lengths and widths of $g_1$ 1011 and $g_4$ 1014 are w and w/2 respectively, and the length and width of $g_a$ 1021 are each w. The capacitances $c_{11}$ 1015 and $c_{34}$ 1017 are determined as:

$$k*(w/2)/(l+w)/2)=kw/(l+w),$$

where k is the dielectric constant of the dielectric, and capacitance is determined per unit length in direction into the paper. The capacitance value $c_{14}=2kw/w=2k$, 1018, and $c_{23}=kl/(w/2)=2kl/w$, 1016.

Clearly:

$c_{bc}$ 1026$=c_{23}$ 1016$=2k$, and $c_{ab}=c_{ac}$.

The series combination of $c_a$ 1024 and $c_{ac}$ 1026 should be the same as that of the series combination of $c_{12}$ 1015, $c_{14}$ 1018 and $c_{34}$ 1017. Simple algebraic manipulation leads to the formula, $c_a$ 1024$=c_{bc}$ 1026$=2wk/(4l+5w)$.

An alternate option for discretization the processing space, is to generates a non uniform grid. This is very helpful and important if accurate results are desired in combination with very high speed processing. Since the field lines are very dense near the corners of conductor segments it is desirable to model the areas with a dense grid to increase the processing accuracy. Regions where the field lines are sparse are modeled using sparse grid lines, also so as to increase the speed of processing.

It is noted that although the description is made for a particular arrangement of steps, the intent and concept of the present invention are suitable and applicable to other arrangements. It will be clear to those skilled in the art that other modifications to the disclosed embodiments can be effected without departing from the spirit and scope of the invention.

What is claimed is:

1. A method comprising:
    acquiring a plurality of capacitance values for a group of interconnecting wires that interconnect a plurality of components in a chip with a plurality of conductor segments, using a data set comprised of technology data for said chip, and geometry and environment data for a first segment of said conductor segments and for a corresponding environment of said first segment, by:
        determining a parallel plate capacitance matrix, a frontal 2-dimensional capacitance matrix, and a lateral 2-dimensional capacitance matrix from said data set;
        merging said parallel plate, frontal and lateral matrices into a merged capacitance matrix;
        extracting from said merged capacitance matrix a self capacitance value, and a plurality of values for a plurality of coupling capacitances between said first conductor segment and each of a plurality of other conductor segments defined in said environment data; and
        storing said self capacitance value and said values of coupling capacitances, and
    designing and/or evaluating the chip using said self capacitance value and said values of coupling capacitances.

2. A method as recited in claim 1, using a next data set comprised of conductor segment data, corresponding environment data, and technology data, for each of said plurality of conductors, said method further comprising the step of repeating said steps of determining, merging, extracting and storing for said plurality of other conductor segments.

3. A method as recited in claim 2, wherein each of said plurality of conductor segments is a part of a net, and said chip comprises a plurality of nets, said method further comprising the step of combining said self capacitance value and said coupling capacitance values of all of said conductor segments belonging to a same net, thereby forming a net self capacitance and a plurality of net coupling capacitances for each of said nets.

4. A method as recited in claim 2, wherein said step of repeating employs at least one of a plurality of other capacitance determining processes, to obtain said self capacitance and said coupling capacitances for a subset of said plurality of conductor segments.

5. A method as recited in claim 4, wherein at least one of said other capacitance determining processes is based upon empirical formulae.

6. A method as recited in claim 2 further comprising the step of employing a plurality of resistance values externally provided, in combination with the self capacitance value, and the plurality of values employing a timing analysis system for obtaining chip timing parameters.

7. A method as recited in claim 1, wherein said step of determining utilizes a grid structure determined by said geometry data and said technology data.

8. A method as recited in claim 7, wherein said grid structure enables the control of an accuracy of a determination result and a speed of determination.

9. A method as recited in claim 8, wherein said accuracy is inversely proportional with said speed of determination.

10. A method as in claim 1, wherein said technology data is for a chemical mechanical polish technology.

11. A method as recited in claim 1 wherein said step of determining comprises:
    determining a processing space in each of a plurality of planes in which a 2-dimensional capacitance determination is performed;
    dividing said processing space into a plurality of subspaces;
    ascertaining a subspace capacitance matrix for each of the subspaces; and
    merging the subspace capacitance matrix of all the subspaces in said processing space to form a processing space capacitance matrix for the processing space.

12. A method as recited in claim 11, wherein said step of ascertaining comprises:
    determining a plurality of parallel and non parallel regions within the subspace;
    determining a parallel plate capacitance value for a plurality of parallel regions not parallel to a via direction;
    dividing each of said non parallel regions into a grid having a structure determined by said geometry data, and said technology data;
    setting up an initial capacitance matrix for the grid structure;
    employing Gaussian Elimination to eliminate all of a plurality of rows and columns corresponding to a plurality of internal grid elements to obtain said subspace capacitance matrix.

13. A method as in claim 12, wherein the subspace capacitance matrix is obtained when at least one of the subspaces includes a plurality of dielectric materials, wherein each of said dielectric materials has a dielectric value, said method further comprising the step of building the grid structure along a plurality of dielectric boundaries, and said step of setting makes use of said dielectric values.

14. A method as recited in 11, wherein said step of ascertaining comprises comparing a first geometry of the subspace with a second geometry in a predefined library, and obtaining and employing a library capacitance matrix if a geometry match exists.

15. A method as recited in claim 11, wherein the subspace capacitance matrix for at least one subspace is obtained from a previous processing step if the conductor segment is part of the environment of a previously processed conductor segment.

16. A method as recited in claim 11, wherein said step of dividing comprises using a specialized grid having a reduced number of grid elements, and wherein said step of setting comprises using a plurality of closed form formulae.

17. A method as in claim 11, wherein said subspace capacitance matrix for two or more subspaces are determined simultaneously.

18. A method comprising:
   determining a plurality of capacitance values for a group of interconnecting wires that interconnect a plurality of components in a chip with a plurality of conductor segments, employing a data set comprised of technology data for said chip, geometry and environment data for a first segment of said conductor segments and for a corresponding environment of said first segment, by:
      determining a parallel plate capacitance matrix, a frontal 2-dimensional capacitance matrix, a lateral 2-dimensional capacitance matrix, and a wiring plane 2-dimensional matrix from said data set;
      merging said parallel plate, frontal, lateral and wiring plane matrices into a merged capacitance matrix;
      extracting from said merged capacitance matrix a self capacitance value, and a plurality of values for a plurality of coupling capacitances between said first conductor segment and each of a plurality of other conductor segments defined in said environment data; and
      storing said self capacitance value and said plurality of values of said coupling capacitances, and
   designing or evaluating the chip using said self capacitance value and said values of coupling capacitances.

19. A system comprising:
   an apparatus to determine a plurality of capacitance values for a group of interconnecting wires that interconnect a plurality of components in a chip with a plurality of conductor segments, using a data set comprised of technology data for said chip, geometry and environment data for a first segment of said conductor segments and for a corresponding environment of said first segment, said apparatus comprising:
      a first processor for determining a parallel plate capacitance matrix, a frontal 2-dimensional capacitance matrix and a lateral 2-dimensional capacitance matrix from said set;
      a second processor for merging said parallel plate, frontal and lateral matrices into a merged capacitance matrix;
      a third processor for extracting from said merged capacitance matrix a self capacitance value, and a plurality of values for a plurality of coupling capacitances between said first conductor segment and each of a plurality of other conductor segments defined in said environment data; and
      storing said self capacitance value and said plurality of values for a plurality of coupling capacitances.

20. An apparatus as recited in claim 19, further comprising:
   using a next data set of conductor segment data, corresponding environment data, and technology data, for each next conductor segment of said plurality of conductors; and wherein said first processor determines a parallel plate capacitance matrix, a frontal 2-dimensional capacitance matrix and a lateral 2-dimensional capacitance matrix from said next data set for said each next conductor segment;
   said second processor merges said parallel plate, frontal and lateral matrices into a merged capacitance matrix for said each next conductor segment;
   said third processor extracts from said merged capacitance matrix a self capacitance value, and a plurality of values for a plurality of coupling capacitances between said next conductor segment and each of a plurality of other conductor segments defined in said environment data for said each next conductor segment; and
   storing said self capacitance value and said plurality of values for a plurality of coupling capacitances for said each next conductor segment.

21. An apparatus as recited in claim 20, wherein each of said plurality of conductor segments is a part of a net, and said chip comprises a plurality of nets, said apparatus further comprising a fourth processor for combining said self capacitance value and said coupling capacitance values of all of said conductor segments belonging to a same net, to form a net self capacitance and a plurality of net coupling capacitances for each of said nets.

22. An apparatus as recited in claim 20, further comprising a fourth processor for employing at least one other of a plurality of other capacitance determining processes for obtaining said self capacitance and said coupling capacitances, for a subset of said conductor segments.

23. An apparatus as recited in claim 22, wherein one of the said other capacitance determining processes is based upon empirical formulae.

24. An apparatus as recited in claim 20, further comprising a timing analysis system using a plurality of resistance values externally provided, in combination with the self capacitance value, and the plurality of values for obtaining chip timing parameters.

25. An apparatus as recited in claim 19, wherein said first processor utilizes a grid structure determined from said next data set.

26. An apparatus as recited in claim 25, wherein said grid structure enables the control of an accuracy of a determination result and a speed of determination.

27. An apparatus as recited in claim 26, wherein said accuracy is inversely proportional with said speed of determination.

28. An apparatus as in claim 19, wherein said technology data is for a chemical mechanical polish technology.

29. An apparatus as recited in claim 19, wherein said first processor determines said frontal, lateral and parallel plate capacitance matrices by:
   determining a processing space in each of a plurality of planes in which a determination is performed,
   dividing said processing space into a plurality of subspaces,
   ascertain a subspace capacitance matrix for each of the subspaces; and
   merging the subspace capacitance matrix of all the subspaces in said processing space to form a processing space capacitance matrix for the processing space.

30. An apparatus as recited in claim 29, wherein said first processor ascertains said subspace capacitance matrix by:
   determining a plurality of parallel and non parallel regions within the subspace,
   determining a parallel plate capacitance value for a plurality of said parallel regions not parallel to a via direction,
   dividing each of said non parallel regions into a grid determined by said data set,
   setting up an initial capacitance matrix for said grid structure, and employing Gaussian Elimination to eliminate all of a plurality of rows and columns corresponding to a plurality of internal grid elements to obtain said subspace capacitance matrix.

31. An apparatus as in claim 30, wherein the subspace capacitance matrix is obtained when a subspace includes a plurality of dielectric materials, each of said dielectric materials has a dielectric value, and said grid structure is formed along dielectric boundaries and said setting up is performed using each of said dielectric values.

32. An apparatus as recited in 29, wherein said first processor performs said ascertaining by comparing a first geometry of the subspace with a second geometry in a predefined library, and obtains a library capacitance matrix if a geometry match exists.

33. An apparatus as recited in claim 29, wherein the subspace capacitance matrix for at least one subspace is obtained from a previous ascertainment if the conductor segment is part of the environment of a previously processed conductor segment.

34. An apparatus as recited in claim 29, wherein said first processor performs said dividing by using a specialized grid having fewer grid elements, and wherein said setting up is performed by using a plurality of closed form formulae.

35. An apparatus as in claim 29, wherein said subspace capacitance matrix for two or more of said subspaces are determined simultaneously.

36. An apparatus to determine a plurality of capacitance values for a group of interconnecting wires that interconnect a plurality of components with a plurality of conductor segments in a chip, using a data set comprised of technology data for said chip, geometry and environment data for a first segment of said conductor segments and for a corresponding environment of said first segment, said apparatus comprising:

a first processor for determining a parallel plate capacitance matrix, a frontal 2-dimensional capacitance matrix, a lateral 2-dimensional capacitance matrix and a wiring plane 2-dimensional matrix extracted from said set;

a second processor for merging said parallel plate, frontal, lateral and wiring plane matrices into a merged capacitance matrix;

a third processor for extracting from said merged capacitance matrix a self capacitance value, and a plurality of values for a plurality of coupling capacitances between said first conductor segment and each of a plurality of other conductor segments defined in said environment data; and a storage system for storing said self capacitance value and said plurality of values; and processing the chip employing a plurality of resistance values specific to said interconnecting wires and provided in combination with said self capacitance value, and said plurality of values stored in said storage system employing a timing analysis system for obtaining chip timing parameters.

37. An article of manufacture comprising a computer usable medium having computer readable program code means embodied therein for causing determination of a plurality of capacitance values for a group of interconnecting wires that interconnect a plurality of components in a chip with a plurality of conductor segments, using a data set comprised of technology data formed from measurement data representing parameters measured on said chip, and geometry and environment data for a first segment of said conductor segments and for a corresponding environment of said first segment, the computer readable program code means in said article of manufacture comprising computer readable program code means for causing a computer to effect:

determining a parallel plate capacitance matrix, a frontal 2-dimensional capacitance matrix, and a lateral 2-dimensional capacitance matrix from said data set;

merging said parallel plate, frontal and lateral matrices into a merged capacitance matrix;

extracting from said merged capacitance matrix a self capacitance value, and a plurality of values for a plurality of coupling capacitances between said first conductor segment and each of a plurality of other conductor segments defined in said environment data; and storing said self capacitance value and said values of coupling capacitances, and designing and/or evaluating the chip using said self capacitance value and said values of coupling capacitances.

38. An article of manufacture as recited in claim 37, the computer readable program code means in said article of manufacture further comprising computer readable program code means for causing a computer to effect:

using a next data set comprised of conductor segment data, corresponding environment data, and technology data, for each of said plurality of conductors; and repeating said steps of determining, merging, extracting and storing for said plurality of other conductor segments.

39. An article of manufacture as recited in claim 38, wherein each of said plurality of conductor segments is a part of a net, and said chip comprises a plurality of nets, the computer readable program code means in said article of manufacture further comprising computer readable program code to effect combining said self capacitance value and said coupling capacitance values of all of said conductor segments belonging to a same net, thereby forming a net self capacitance and a plurality of net coupling capacitances for each of said nets.

40. A computer program product comprising a computer usable medium having computer readable program code means embodied therein for causing determination of a plurality of capacitance values for a group of interconnecting wires that interconnect a plurality of components in a chip with a plurality of conductor segments, using a data set comprised of technology data of said chip, and geometry and environment data for a first segment of said conductor segments and for a corresponding environment of said first segment, the computer readable program code means in said article of manufacture comprising computer readable program code means for causing a computer to effect:

determining a parallel plate capacitance matrix, a frontal 2-dimensional capacitance matrix, and a lateral 2-dimensional capacitance matrix from said data set;

merging said parallel plate, frontal and lateral matrices into a merged capacitance matrix;

extracting from said merged capacitance matrix a self capacitance value, and a plurality of values for a plurality of coupling capacitances between said first conductor segment and each of a plurality of other conductor segments defined in said environment data; and storing said self capacitance value and said values of coupling capacitances, and designing and/or evaluating the chip using said self capacitance value and said values of coupling capacitances.

41. An article of manufacture comprising a computer usable medium having computer readable program code means embodied therein for causing a determination of a plurality of capacitance values for a group of interconnecting wires that interconnect a plurality of components in a chip with a plurality of conductor segments, employing a data set comprised of technology data for said chip, geometry and environment data for a first segment of said conductor segments and for a corresponding environment of said first segment, the computer readable program code means in said article of manufacture comprising computer readable program code means for causing a computer to effect:

determining a parallel plate capacitance matrix, a frontal 2-dimensional capacitance matrix, a lateral 2-dimensional capacitance matrix, and a wiring plane 2-dimensional matrix from said data set;

merging said parallel plate, frontal, lateral and wiring plane matrices into a merged capacitance matrix;

extracting from said merged capacitance matrix a self capacitance value, and a plurality of values for a plurality of coupling capacitances between said first conductor segment and each of a plurality of other conductor segments defined in said environment data;

storing said self capacitance value and said plurality of values of said coupling capacitances; and designing and/or evaluating the chip using said self capacitance value and said values of coupling capacitances.

42. A method of using a computer processor to receive data representing a group of interconnecting wires that interconnect a plurality of components in a chip with a plurality of conductor segments, said data including a data set comprised of technology data derived from measurements made upon said chip, and geometry data for a first segment of said conductor segments and for a corresponding environment of said first segment, and performing calculations to determine a plurality of capacitance values for said chip, by:

determining a parallel plate capacitance matrix, a frontal 2-dimensional capacitance matrix, and a lateral 2-dimensional capacitance matrix from said data set;

merging said parallel plate, frontal and lateral matrices into a merged capacitance matrix;

extracting from said merged capacitance matrix a self capacitance value, and a plurality of values for a plurality of coupling capacitances between said first conductor segment and each of a plurality of other conductor segments defined in said environment data; and storing said self capacitance value and said values of coupling capacitances, and designing or evaluating the chip using said self capacitance value and said values of coupling capacitances.

* * * * *